United States Patent
Fjelstad et al.

(10) Patent No.: US 6,205,660 B1
(45) Date of Patent: Mar. 27, 2001

(54) METHOD OF MAKING AN ELECTRONIC CONTACT

(75) Inventors: Joseph Fjelstad, Sunnyvale; John W. Smith, Palo Alto; Thomas H. Distefano, Monte Sereno; James Zaccardi, Sunnyvale; A. Christian Walton, Belmont, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 08/845,014

(22) Filed: Apr. 22, 1997

Related U.S. Application Data

(60) Division of application No. 08/306,205, filed on Sep. 14, 1994, now Pat. No. 5,632,631, which is a continuation-in-part of application No. 08/254,991, filed on Jun. 7, 1994, now Pat. No. 5,802,699.

(51) Int. Cl.[7] .................................................... H01R 43/00
(52) U.S. Cl. ................................ 29/885; 29/884; 439/66; 439/71; 216/13; 216/17; 216/41; 216/51
(58) Field of Search ................................ 216/13, 17, 41, 216/51, 78; 29/874, 884, 885, 413, 414; 439/77, 71, 66

(56) References Cited

U.S. PATENT DOCUMENTS 3,075,866 * 1/1963 Baker et al. .......................... 156/13
3,275,736     9/1966 Hotine et al. .

(List continued on next page.)

FOREIGN PATENT DOCUMENTS

| 0453716 A2 | 10/1991 | (EP) . |
| 0529577 A2 | 3/1993 | (EP) . |
| 57-143838 | 9/1982 | (JP) . |
| 06085425 | 3/1994 | (JP) . |
| 6-61367 * | 3/1994 | (JP) . |
| 8502751 | 6/1985 | (WO) . |

OTHER PUBLICATIONS

Eric P. Hermann, "Silicon Chip Separation to Permit Chip Butting", RCA Technical Notes, pp 1–2, May 14, 1975.*

T.L. Ellis & F.W. Haining, "Circuit Feature Protection Protection During Flash Etch", IBM Technical Disclosure Bulletin, Sep. 1977.*

R.L. Melcher & N.S. Shiren, "Method for Selective Plating and Etching Using Resistive Heating", IBM Technical Disclosure Bulletin, Aug. 1981.*

(List continued on next page.)

Primary Examiner—Carl J. Arbes
(74) Attorney, Agent, or Firm—Lerner, David, Littenberg, Krumholz & Mentlik, LLP

(57) ABSTRACT

Microelectronic contacts, such as flexible, tab-like, cantilever contacts, are provided with asperities disposed in a regular pattern. Each asperity has a sharp feature at its tip remote from the surface of the contact. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

15 Claims, 12 Drawing Sheets

U.S. PATENT DOCUMENTS

| | | | |
|---|---|---|---|
| 3,509,270 | 4/1970 | Dube et al. | 174/68 |
| 3,616,532 | 11/1971 | Beck | 29/625 |
| 3,670,409 | 6/1972 | Reimer | 439/55 |
| 3,797,103 | 3/1974 | Desmond et al. | 437/183 |
| 3,818,415 | 6/1974 | Evans et al. | 439/393 |
| 3,937,386 | 2/1976 | Hartleroad et al. | 228/180 |
| 3,998,377 | 12/1976 | Metz | 228/180 |
| 4,283,839 | 8/1981 | Gursky | 29/589 |
| 4,295,596 | 10/1981 | Doten et al. | 228/180 |
| 4,557,043 | 12/1985 | Starsky | 29/741 |
| 4,597,617 | 7/1986 | Enochs | 439/66 |
| 4,655,519 | 4/1987 | Evans et al. | 439/74 |
| 4,676,564 | 6/1987 | Mitchell, Jr. | 439/77 |
| 4,696,096 | 9/1987 | Green et al. | 29/829 |
| 4,783,719 | 11/1988 | Jamison et al. | 439/68 |
| 4,818,728 | 4/1989 | Rai et al. | 439/209 |
| 4,846,704 | 7/1989 | Ikeya | 439/72 |
| 4,887,760 | 12/1989 | Yoshino et al. | 228/56.3 |
| 4,893,172 | 1/1990 | Matsumoto et al. | 174/254 |
| 4,901,904 * | 2/1990 | Tsuno | 228/56.3 |
| 4,913,336 | 4/1990 | Yamazaki | 228/106 |
| 4,924,353 | 5/1990 | Patraw | 361/783 |
| 4,937,006 | 6/1990 | Bickford et al. | 228/219 |
| 4,950,173 | 8/1990 | Minemura et al. | 439/82 |
| 4,950,623 | 8/1990 | Dishon | 439/82 |
| 4,975,079 | 12/1990 | Beaman et al. | 439/482 |
| 5,006,792 | 4/1991 | Malhi et al. | 439/68 |
| 5,006,917 | 4/1991 | Kang et al. | 257/162 |
| 5,046,953 | 9/1991 | Shreeve et al. | 439/66 |
| 5,053,922 | 10/1991 | Matta et al. | 361/720 |
| 5,056,216 | 10/1991 | Madou et al. | 29/843 |
| 5,057,969 | 10/1991 | Ameen et al. | 361/720 |
| 5,086,337 | 2/1992 | Noro et al. | 257/726 |
| 5,105,537 * | 4/1992 | Datta et al. | 29/884 |
| 5,115,964 | 5/1992 | Ameen et al. | 228/180.22 |
| 5,123,850 | 6/1992 | Elder et al. | 439/67 |
| 5,131,852 | 7/1992 | Grabbe et al. | 439/71 |
| 5,133,495 | 7/1992 | Angulas et al. | 228/180.1 |
| 5,152,695 | 10/1992 | Grabbe et al. | 439/71 |
| 5,154,341 | 10/1992 | Melton et al. | 228/180.22 |
| 5,161,729 | 11/1992 | Dunaway et al. | 228/179 |
| 5,172,473 * | 12/1992 | Burns et al. | 29/885 |
| 5,173,055 | 12/1992 | Grabbe | 439/66 |
| 5,181,859 | 1/1993 | Foreman et al. | 439/225 |
| 5,196,726 | 3/1993 | Nishiguchi et al. | 257/737 |
| 5,199,879 | 4/1993 | Kohn | 439/63 |
| 5,203,075 | 4/1993 | Angulas et al. | 228/180.22 |
| 5,207,585 | 5/1993 | Byrnes et al. | 439/66 |
| 5,228,861 | 7/1993 | Grabbe | 439/66 |
| 5,239,127 | 8/1993 | Swikle et al. | 174/35 R |
| 5,261,155 | 11/1993 | Angulas et al. | 29/830 |
| 5,261,593 | 11/1993 | Casson et al. | 228/180.22 |
| 5,281,684 | 1/1994 | Moore et al. | 427/96 |
| 5,282,565 | 2/1994 | Melton | 228/180.22 |
| 5,328,087 | 7/1994 | Nelson et al. | 228/175 |
| 5,346,118 | 9/1994 | Degani et al. | 228/180.22 |
| 5,349,495 | 9/1994 | Visel et al. | 228/180.22 |
| 5,349,500 | 9/1994 | Casson et al. | 439/85 |
| 5,354,205 | 10/1994 | Feigenbaum et al. | 439/67 |
| 5,355,569 * | 10/1994 | Marek et al. | 29/25.41 |
| 5,430,614 | 7/1995 | Difrancesco . | |
| 5,500,605 | 3/1996 | Chang . | |
| 5,829,124 * | 11/1998 | Kresge et al. | 29/840 |

OTHER PUBLICATIONS

IEEE Transaction on Components, Packaging and Manufacturing Technology, Part A, vol. 18, No. 2, Jun. 1995, "Constriction Resistance of Microcone–Based Contacts".

1994 ITAP & Flip Chip Proceedings, "Mechanical Interconnection System For Solder Bump Dice", Hill, et al. (pp. 82–86).

Multichip Module Technologies and Alternatives: The Basics, Alan D. Knight, (pp. 504–509; 521–523).

"Supplemental Interconnection Devices", Ginsberg, et al., Multichip Modules & Related Technologies, (pp. 201–229).

Multi–Chip Module Technologies and Alternatives: The Basics, Donn et al. EDS Van Nostrand Rhinehold Company 1993, Chapter 10 (patent prosecution. 487–524).

TRW Data Technologies 1994 Brochure.

Design New, Jan. 17, 1994, "Tiny Filter Quashes EMI".

"Constriction Resistance of Microcone–Based Contacts", IEEE Transactions on Components, Packaging, and Manufacturing Technology—Part A, vol. 18, No. 2, Jun. 1995.

1994 ITAP & Flip Chip Proceedings, "A Tab Tape–Based bare Chip Test and Burn–In Carrier", Nolan et al. (pp. 173–179).

Electronic Buyers' News, Issue 867, Aug. 16, 1993, "Quieting Connectors Down" by David Gabel.

* cited by examiner

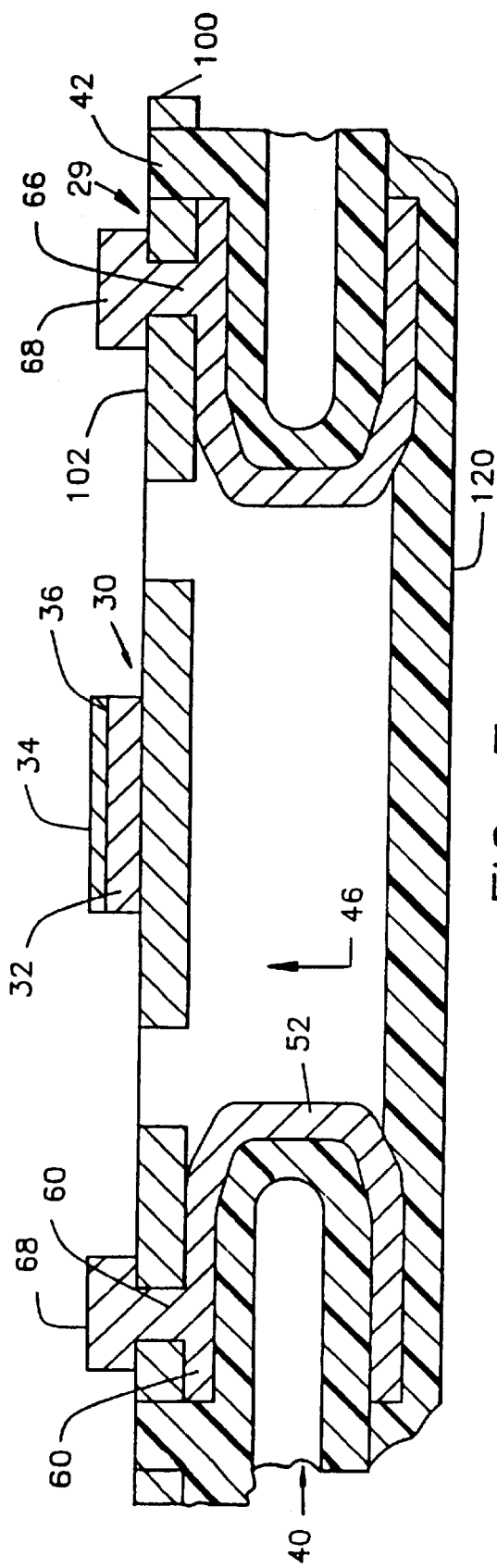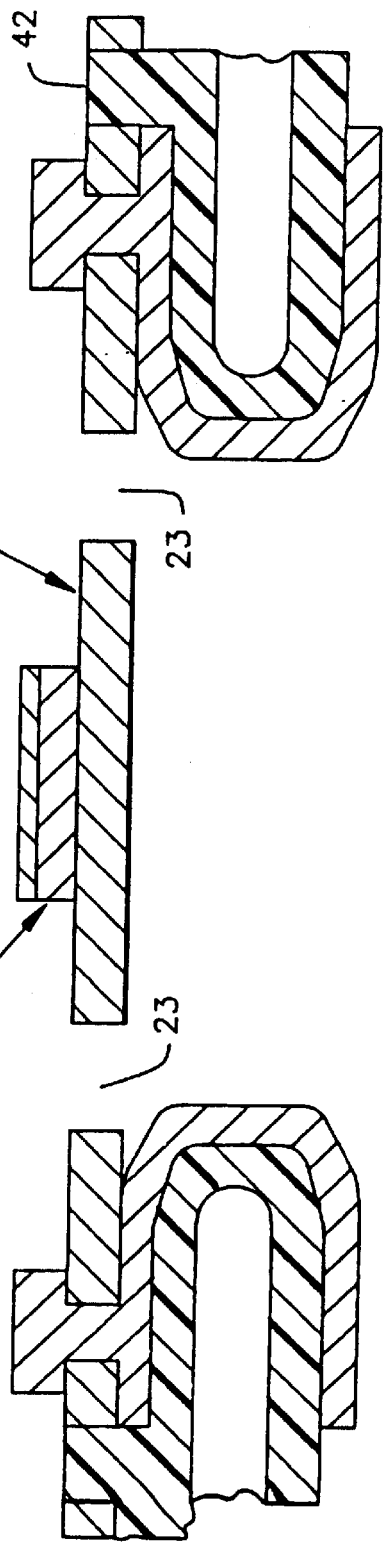
FIG. 7
FIG. 8

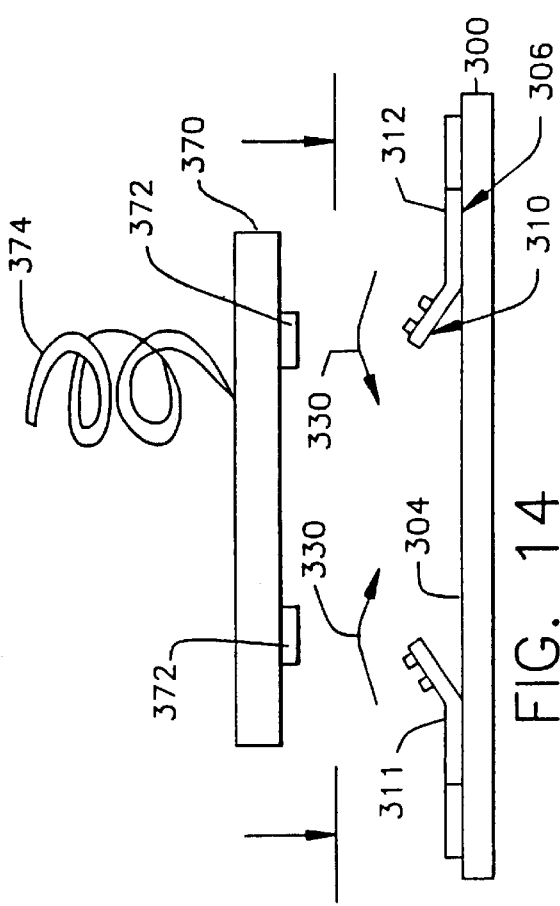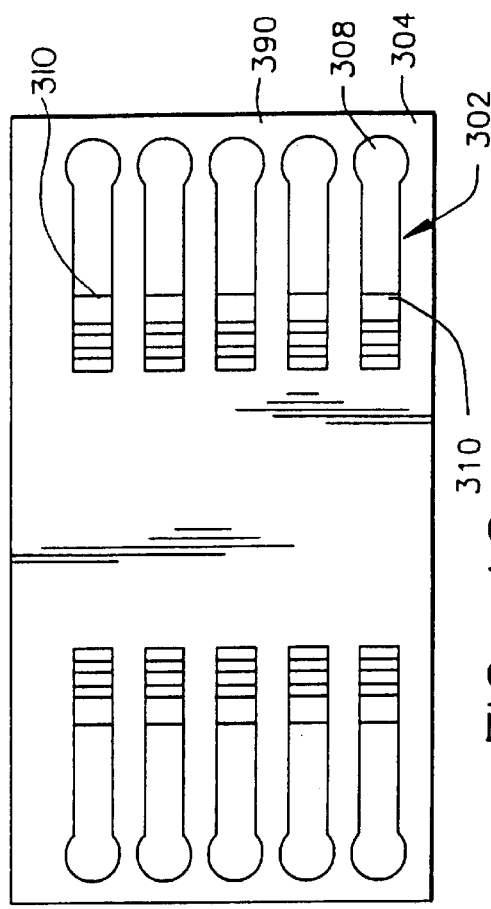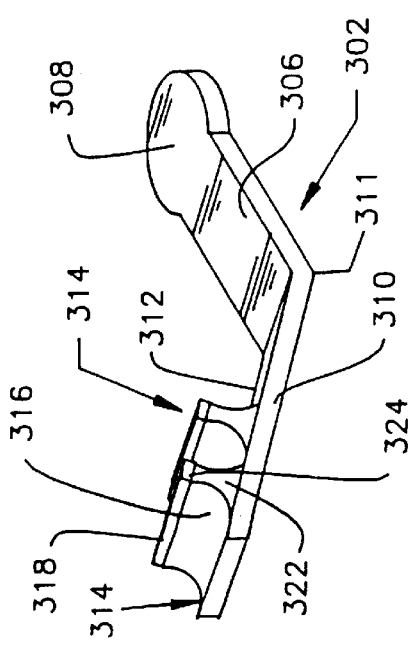
FIG. 14
FIG. 12
FIG. 13

METHOD OF MAKING AN ELECTRONIC CONTACT

This is a division of application Ser. No. 08/306,205, filed on Sep. 14, 1994 now U.S. Pat. No. 5,632,631 which is a continuation-in-part of application Ser. No. 08/254,991, filed on Jun. 7,1994, now U.S. Pat. No. 5,802,699.

The present application is a continuation in part of U.S. Pat. application No. 08/254,991 filed Jun. 7,1994, the disclosure of which is hereby incorporated by reference herein.

BACKGROUND OF THE INVENTION

The present invention relates to contacts for microelectronic devices such as semiconductor chips and the associated circuit panels, connectors and related devices to methods of making and using such contacts, and to components such as sockets and other connectors including such contacts.

Microelectronic circuits require numerous connections between elements. For example, a semiconductor chip may be connected to a small circuit panel or substrate, whereas the substrate may in turn be connected to a larger circuit panel. The chip to substrate or "first level" interconnection requires a large number of individual electrical input and output ("I/O") as well as power and ground connections. As chips have become progressively more complex, the number of I/O connections per chip has grown so that hundreds of connections or more may be needed for a single chip. To provide a compact assembly, all of these connections must be made within a relatively small area, desirably an area about the area of the chip itself. Thus, the connections must be densely packed, preferably in an array of contacts on a regular grid, commonly referred to as a "Bump Grid Array" or "BGA". The preferred center-to-center distance between contacts or "contact pitch" for chip mountings is on the order of 1.5 mm or less, and in some cases as small as 0.5 mm. These contact pitches are expected to decrease further. Likewise, chip mounting substrates and other circuit panels used in microelectronics have become progressively more miniaturized, with progressively greater numbers of electrical conductors per unit area. Connectors for these miniaturized panel structures desirably also have very small contact pitch. Connections of chip mounting substrates to other elements are referred to as "second-level" inter connections.

In some cases, the connections may include permanent metallurgical bonding of the mating contacts to one another, as by soldering, brazing, thermocompression or thermosonic bonding, welding and the like. For example, electrical contacts on a semiconductor chip may be bonded to the mating contact pads of a substrate by solder bumps. Alternatively, the connection may be made so that the mechanical interengagement of the mating elements provides electrical continuity. Such a connection usually is separable, so that the connected elements can be removed. For example, contacts on a chip may be temporarily engaged with mating contacts of a test fixture under mechanical load.

Microelectronic connections must meet numerous, often conflicting requirements. As mentioned above, the size of the device poses a major concern. Further, such connections often are subject to thermal cycling strains as temperatures within the assembly change. The electrical power dissipated within a chip or other microelectronic element tends to heat the elements so that the temperatures of the mating elements rise and fall each time the device is turned on and off. As the temperatures change, the various connected elements expand and contract by different amounts, tending to move the contacts on one element relative to the mating contacts on the other element. Changes in the temperature of the surrounding environment can cause similar effects.

The connections must also accommodate manufacturing tolerances in the contacts themselves and in the connected elements. Such tolerances may cause varying degrees of misalignment. Additionally, contamination on the surfaces of the mating contact parts can interfere with the connection. This can occur in metallurgically bonded connections and, particularly, in mechanically interengaged connections. Therefore, the contact system should be arranged to counteract the effects of such contaminants. All of these requirements, taken together, present a formidable engineering challenge.

Various approaches have been adopted towards meeting these challenges. For example, Patraw, U.S. Pat. No. 4,716,049; U.S. Pat. No. 4,902,606 and U.S. Pat. No. 4,924,353 all disclose flexible, outstanding projections on a substrate, each such projection being generally dome-shaped. The chip itself is provided with a so-called "mesa" member having multiple conductive pads coupled to the actual contacts of the chip. A spring biases the chip and hence the pads on the mesa member against the dome-shaped members. Minemura et al, U.S. Pat. No. 4,950,173 discloses a relatively coarse-pitched connector in which pin-shaped contacts, thread into holes in insulating support. Contact tabs formed from a shape memory alloy are then brought into engagement with the pin by changing the temperature, causing the tabs to change shape and hence engage the pin. This provides a so-called "zero insertion force" system in which the pin is not engaged or wiped by the tabs. Hotine et al, U.S. Pat. No. 3,275,736 also discloses a relatively coarse, second-level interconnect structure. In this structure, all contact including a ring with a plurality of fingers extending inwardly from the ring is engaged on a pin-like lead extending from a microelectronic component. Each of the fingers has a point at its tip, and these points scrape the leads as the parts are engaged. Once the parts are engaged, the fingers may be metallurgically bonded to the leads as by welding. Shreve et al, U.S. Pat. No. 5,046,953 describes a tape automating bonding or "TAB" arrangement using a dielectric tape with conductive leads thereon in which the leads themselves are dimpled or in which sets of spherical particles are interposed between the leads and the mating contacts so as to provide an indenting and scrubbing action when the leads of the tape are pressed against the contacts. Grabbe, U.S. Pat. No. 5,173,055 discloses a "area array connector" including plate-like springs with upwardly projecting fingers to the main gauge plate-like contacts on the mating part. U.S. Pat. No. 5,152,695 discloses similar arrangements, in which the fingers are provided with apparently rounded or spherical raised bumps formed by adding a raised area of gold using a wire bonding machine and then "mechanically profiling" the raised area or by welding a gold wire onto the contact finger and coining the wire into the final shape. Grabbe et al, U.S. Pat. No. 5,131,852 discloses a tape-based connection system in which contacts on a flexible tape are supported by spring fingers and thus pressed against contact pads on semiconductor chip. Here again, the contacts are provided with rounded raised sections formed by electroforming, wire bonding or the like.

Ikeya, U.S. Pat. No. 4,846,704 discloses a test socket for testing large, second level interconnections, the test socket having numerous spring fingers which engage the exposed leads connected to the chip. Each of these spring fingers has sharp edges for making contact with the exposed lead. Still other connectors are disclosed in the text Multi-chip Module Technologies and Alternatives; The Basics, Donn et al, EDS, Van Nostrand Rhinehold Company 1993, Chapter 10, (pp. 487–524) entitled MCM To Printed Wiring Board (Second Level) Connection Technology Options, by Alan D. Knight.

Evans et al, U.S. Pat. No. 3,818,415 discloses a large-scale electrical connector having a contact surface with adhering fine particles of a grit, these particles being covered by tough, metal coating. These particles are said to scrape away adhering insulation on a mating conductor. Hill et al, Mechanical Interconnection System For Solder Bump Dice, 1994 ITAP and Flip Chip Proceedings (pp. 82–86) disclose a test connector for engaging solder bumps on microelectronic chips. The connector includes a flat surface with a set of pads in an array corresponding to the array of solder bumps on the pads. Each pad on the fixture has a so-called "dendritic" or "random pattern" of small palladium needles, typically about 200–500 needles per square millimeter. These needles or dendrites are forced against the solder bumps during use, so that the dendrites penetrate contaminant films on the solder bumps and make electrical contact.

Caine et al, U.S. Pat. No. 5,006,917 describes a tape automated bonding system in which a dielectric tape is provided with multiple leads, all having exposed inner tips. These tips are provided with non-dendritic, rough surfaces having ridges spaced apart from one another at a peak-to-peak distance of approximately 1 micron. These lead tips are then bonded to pads on a semiconductor chip by thermocompression bonding.

Burns et al, U.S. Pat. No. 5,207,585 describes a "interface pellicle" including a flexible, dielectric membrane and a large number of electrodes extending through the dielectric membrane. Each electrode has a dome-like upper surface disposed on the top surface of the membrane and a roughened bottom surface disposed on the bottom side of the membrane. The pellicle can be used by placing the membrane between a mounting substrate having contact pads and a chip or other component having solder balls so that the textured bottom surface of the electrodes face the solder balls whereas the dome-like top surfaces face the contact pads of the substrate. The substrate and the component are then forced together so that each electrode is squeezed between a contact pad and a solder pad. The rough bottom surfaces indent the surfaces of the solder balls.

Despite these efforts in the art, there has still been a need for further improvement.

SUMMARY OF THE INVENTION

The present invention addresses this need.

One aspect of the present invention provides a contact for a microelectronic device. The contact according to this aspect of the invention includes a base portion defining a base surface, and one or more asperities preferably integral with the base portion and protruding upwardly from the base surface to a height of less than about 40 microns, more preferably less than about 25 microns. Each such asperity defines a tip surface remote from the base surface and a substantially sharp edge bounding the tip surface. Each asperity desirably includes a column of a first metal extending upwardly from the base surface. Each asperity may also include a cap of a second metal defining the sharp edge and the tip surface. The second metal preferably is a substantially etch-resistant metal, and may be harder than the first metal. The second metal may be selected from the group consisting of gold, osmium, rhenium, platinum, palladium and alloys and combinations thereof. Alternatively or additionally, the tip surfaces of the asperities may carry electrically conductive bonding materials adapted to form metallurgical bonds with time mating electrical elements. Preferably, the tip surfaces of the asperities are substantially flat, and hence provide appreciable surface for carrying the bonding material. The first metal may be selected from the group consisting of copper and copper-bearing alloys. The base portion of each contact may include one or more metallic layers such as copper or copper-bearing alloys, and preferably includes a metal having resilient characteristics such as beryllium copper or phosphor bronze. Alternatively, the base portion of each contact may include a polymeric structural layer in addition to a conductive, desirably metallic, layer.

Each asperity may be substantially cylindrical, most preferably in the form of a right circular cylinder, and each of the aforementioned sharp edges may be substantially in the form of a circle encircling the tip of the asperity. Alternatively, each asperity may be substantially in the form of an elongated slab, each such slab defining at least one generally vertical major surface intersecting the tip surface of the asperity so that the intersection defines an elongated straight edge, such straight edge forming part of the sharp edge. The base portion of each contact may include an anchor region and at least one tab or projection formed integrally with the anchor region. The asperity or asperities may be disposed on each tab remote from the anchor region. In use, the anchor region of such a contact is fixed to a connector body or other support, whereas the tab is free to bend. When a lead, contact pad or other mating electrical element is engaged with the tab, the tab bends and the mating element and tab move relative to one another to provide a wiping motion. The resilience of the tab causes the sharp edge of the asperity to bear on the mating element and scrape the mating element. The anchor region of each contact may be part of a substantially ring-like common anchor region. A contact unit may include such co common anchor region and a plurality of tabs extending inwardly from the ring-like anchor region towards a common center.

Further aspects of the present invention include connectors including the contacts discussed above. Thus, a connector according to this aspect of the invention may include a contact having a base portion and one or more asperities thereon, each asperity having a tip surface and a substantially sharp edge bounding the tip surface, the contact being mounted to the body so that when a mating element is engaged with the contact, the mating contact element will be wiped across the asperity and pressed against the asperity, causing the sharp edge of the asperity to scrape the mating contact element. Preferably, the anchor region of the contact is secured to the body and the projection is free to flex. In this arrangement, the resilience of the projection causes the asperity to engage the mating element. Where a contact unit includes a ring-like anchor region and plural tabs extending inwardly therefrom, the contact unit may be mounted to the body of the connector so that the ring-like anchor region extends around a hole and so that the tabs extend inwardly over the hole, with the asperities pointing generally up, away from the body. When the mating contact element is forced into the hole, the tabs bend downwardly and the asperities engage the mating contact element.

A further aspect of the present invention provides a connector including a plurality of contact base portions, said base portions being disposed in a regular contact pattern. Each contact base portion defines a base surface. The contact assembly further includes a plurality of asperities, each such asperity protruding upwardly from the base surface of the associated contact base portion. Each such asperity has a tip remote from the base surface and a substantially sharp feature at such tip. The asperities may be disposed in a regular, predetermined asperity pattern. The asperity pattern is in registration with the contact pattern so that at least one asperity is disposed on each contact base portion. The contact base portions may be substantially identical to one another and the asperities may be disposed in substantially the same location on each such contact base portion. The connector may further include at least one anchor region, and the contact base portions may include a plurality of flexible tabs connected to such anchor region or regions, each such tab having a distal end remote from the associated anchor region. In such an arrangement, the asperities desirably are located on each such tab adjacent the distal end thereof.

In connectors according to this aspect of the invention, the regular distribution of asperities on the contact portions assures that the asperities are present on most or all of the contact portions even where the spacings between adjacent asperities are large relative to the size of the contact portions themselves. Stated another way, there is no need to pack the surface with closely spaced asperities in order to assure that each contact portion is provided with an asperity. Accordingly, each asperity may stand out from the base surface unencumbered by surrounding asperities This promotes effective scraping action, particularly in the case of very small contacts and asperities.

A further aspect of the present invention, provides methods of engaging a microelectronic element with a connector. Such methods include the step of moving the microelectronic element relative to the body of the connector so that asperities carried on contacts included in the connector scrape electrical elements, such as leads or contact pads, on the sharp edges on the tips of the asperities engage and scrape the conduct element of the microelectronic device. Preferably, the contact portions include flexible tabs and the asperities are disposed on the flexible tabs. During the engagement step, the tabs are distorted by engagement with the mating electrical mating elements of the microelectronic device, so that the projections urge the asperities into engagement with the contact elements. The method according to this aspect of the present invention may further include the step of forming a permanent metallurgical bond between the contacts and the terminals of the microelectronic element. The bonding step can be performed by activating an electrically conductive material carried by the contacts or by the engaged elements of the microelectronic device. Alternatively or additionally, the method may include the step of actuating the microelectronic element by applying signals through the contacts and the engaged elements of the microelectronic device without formation of a metallurgical bond or before such a bond is formed. Thus, the microelectronic element and its engagement with the contacts can be tested before permanent bonding. Here again, the scraping action provided by the sharp fractures on the asperities promotes reliable contact before bonding, as well as reliable bonding.

Further aspects of the present invention provides methods of making microelectronic contacts. One method according to this aspect of the present invention desirably includes the step of depositing an etch-resistant material in a plurality of spots on a top surface of a sheet which includes a first metal at the top surface and then etching the first metal in a first etching process so that at least a portion of the first metal is removed in areas other than said spots, so that the etched areas defines a base surface and so that areas covered by the spots form asperities projecting upwardly from the base surface. The depositing and etching steps form tips on the asperities, remote from the base surface, and also forms substantially sharp edges bounding the tips. The etch resistant material may be a second metal and the second metal may at least partially define the sharp edges of the tips. The second metal may be a metal selected from the group consisting of gold, osmium, rhenium, platinum, palladium alloys and combinations thereof, whereas the first metal desirably is selected from the group consisting of copper and copper-bearing alloys.

The sheet may include a layer of a stop metal resistant to the etchant used to etch the first metal. The stop layer may be formed from a metal such as nickel which is substantially more resistant than the first metal to etching by certain solutions. As further discussed below, the stop layer may be susceptible to etching by other solutions or procedures. The etching step may be continued until the stop metal is exposed in the etched areas, so that the stop metal layer defines the base surface. The method desirably further includes the step of subdividing the sheet into a plurality of contact units, each including one or more contacts, the subdividing and etching steps being conducted so that at least one asperity is disposed on each such contact. The subdividing step may include a further etching process. This further etching process may include the step of etching the sheet from a bottom surface, opposite from the top surface.

The etch from the bottom surface may be performed before the top surface etching step and may form grooves in the bottom surfaces. The sheet may be secured to a body after the bottom surface etching step but before the top surface etching step. Where no stop layer is employed, the top surface etching step will break through the sheet at the grooves, thereby severing the individual contact units from one another. Where a stop layer is provided, the bottom surface etching step, and hence the grooves formed in that step, will terminate at the stop layer. After the top surface etching step, the exposed stop layer is treated with a further etchant or with another treatment to remove the stop layer at least at the grooves, thereby severing the contact units from one another. In either process, the sheet desirably remains coherent until after the sheet has been mounted to the body. In further processes according to the invention, the sheet may include a bottom polymeric layer, and the step of subdividing the sheet may include the step of forming channels in the stop layer and exposing the sheet to radiant energy, so that the stop layer serves as a mask and so that the polymeric layer is cut at the channels.

The step of depositing the etch-resistant tip material desirably is performed by applying a resist to the top surface of the sheet and then exposing the resist either to radiant energy in a pattern constituting the positive or negative image of the spots or else exposing the resist to energetic, charged particles, such as alpha particles, also in a pattern corresponding to a positive or negative image of the spots. The exposed resist is then developed and treated to remove either the exposed or unexposed regions leaving either a positive or negative image of the spots. The resist itself may serve as the etch-resistant material, in which case the resist is later removed after formation of the asperities. Alternatively, the resist may be used to control deposition of an etch-resistant metal in an electroplating step. Use of energetic charged particles such as alpha particles to expose the resist is particularly advantageous where the sheet is embossed or otherwise non-planar at the time of the exposing step.

Yet another aspect of the present invention provides methods of making a microelectronic contact including the steps of etching a sheet incorporating a first metal at such top surface so that at least a portion of the first metal is removed except at locations in a predetermined asperity pattern. Thus, the etched areas define a base surface and asperities project upwardly from the base surface at locations of said asperity pattern. The etching step applied to the top surface is conducted so as to form tips on the asperities remote from the base surface and sharp features at each such tip. The method according to this aspect of the invention desirably also includes the step of severing the sheet according to a predetermined severing pattern, to form a plurality of contact units, each including one or more contacts, the severing pattern and the asperity pattern being in registration with another so that at least one asperity is disposed on each contact. The severing process may be conducted by etching as aforesaid.

These and other objects, features and advantages of the present invention will be more readily apparent from the detailed description of the preferred embodiments set forth below, taken in conjunction with the accompany drawings.

BRIEF DESCRIPTION OF THE DRAWINGS

FIGS. 4–8 are fragmentary, diagrammatic sectional views depicting portions of the connector of FIGS. 1–3 at stages of a manufacturing process in accordance with a further embodiment of the invention.

FIG. 12 is a diagrammatic plan view depicting a connector in accordance with a further embodiment of the invention.

FIG. 13 is a diagrammatic, perspective view depicting a contact used in the connector of FIG. 12.

FIG. 14 is a diagrammatic elevational view of the connector shown in FIGS. 12 and 13.

DETAILED DESCRIPTION OF THE PREFERRED EMBODIMENTS

Figure 1:
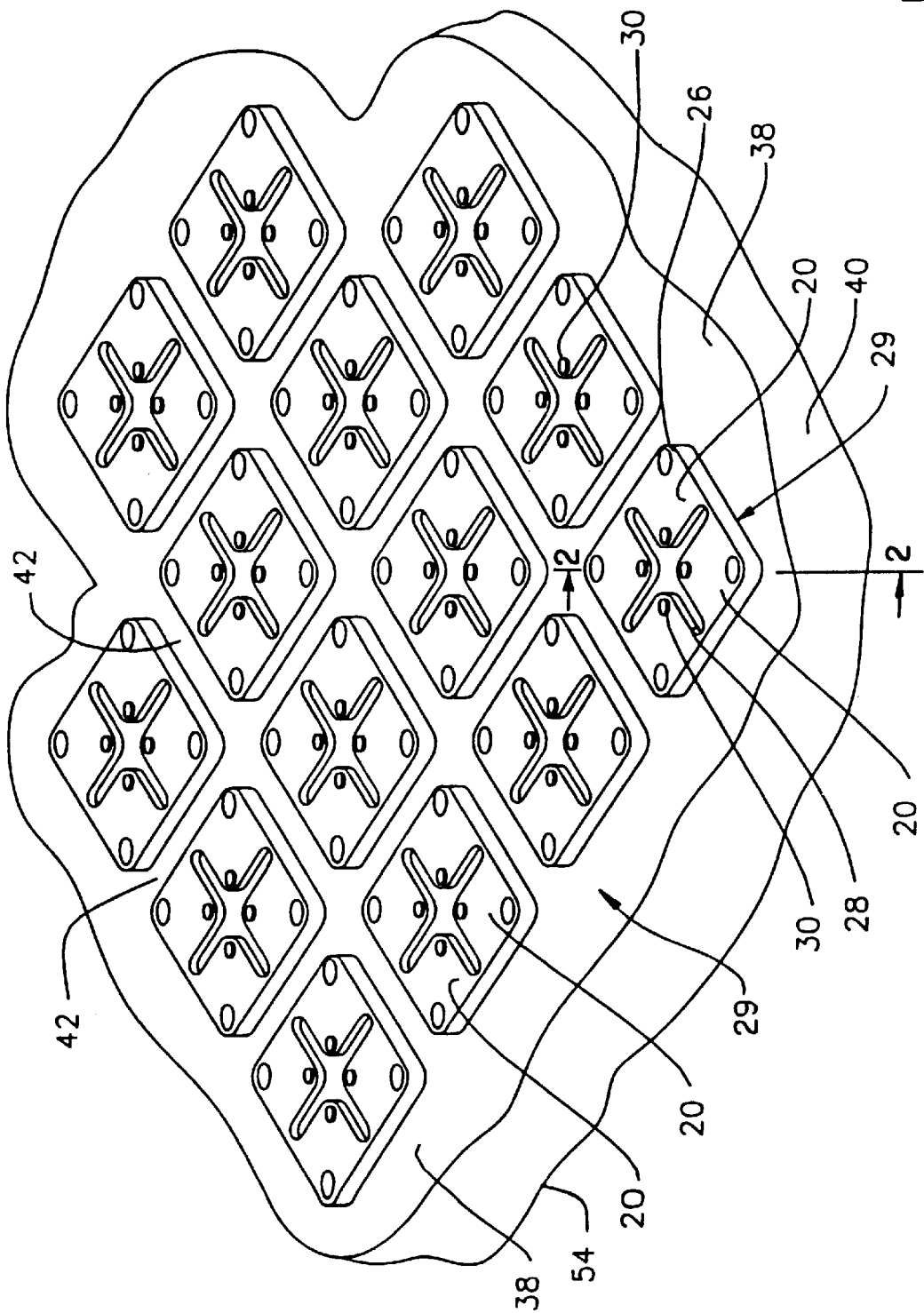
FIG. 1 is a fragmentary, diagrammatic perspective view depicting portions of a contact assembly in accordance with one embodiment of the present invention.

A connector according to one embodiment of the invention includes a plurality of independent, electrical contact ends 29. Each contact unit includes four contacts 20. Each contact 20 includes a small metallic tab incorporating a base layer 22 (FIG. 2) defining an upwardly facing base surface 24. The base portion of each contact desirably is formed from a resilient metal selected from the group consisting of copper, copper-bearing alloys, stainless steel and nickel. Beryllium copper is particularly preferred. The base portion desirably may be between about 10 and about 25 microns thick. A layer 25 of an etch metal such as nickel used in the contact formation process as further described below may be disposed on base surface 24. Layer 25 desirably is between about 0.5 and 2.0 microns thick. Each such tab is joined to a generally square, ring-like anchor portion 26 integral with the tab. Each tab has a tip 28 at the end of the tab remote from the anchor portion.

Four tabs extend inwardly from each anchor portion 26, the tabs being separated from one another by channels 23. Each contact or tab 20 has an asperity 30 projecting upwardly from the base surface 24 adjacent the tip 28 of the tab. Each asperity includes a column 32 of a first or base metal integral with base portion 22 and further includes a cap 34 overlying the column 32 at the uppermost tip of the asperity, remote from base surface 24. Each column 32 is generally cylindrical or frustoconical in shape, so that the tip of each column is substantially circular. The cap of each column defines a flat, circular tip surface and substantially sharp edge 36 encircling the tip surface. Each asperity desirably protrudes upwardly from the base surface less than about 50 microns, more preferably between about 5 microns and about 40 microns, and most preferably between about 12 microns and about 25 microns. Each asperity may be between about 12 and about 50 microns in diameter, more preferably about 12 to about 35 microns in diameter. The cap metal 34 may be selected from the group consisting of metals resistant to etching by etchants which etch the first or base metal. Cap metals selected from the group consisting of gold, silver, platinum, palladium, osmium, rhenium and combinations thereof are preferred. As further discussed below, such etch-resistant metals aid in formation of sharp edges 36. Moreover, the harder etch-resistant metals, particularly osmium and rhenium, aid in preserving the edge during use.

The contact units are disposed on the top surface 38 of a connector body 40, and spaced apart from one another so that there are slots 42 between adjacent connector units. Connector body 40 incorporates a sheet-like, metallic element 44 having holes 46 therein. The metallic layer is covered by a bottom dielectric layer 48 and a top dielectric layer 50, which merge with one another within holes 46, so that the dielectric layer cooperatively lines the holes as well. A conductive metallic via liner 52 extends through each hole 46 from the top surface 38 of the connector body to the opposite, bottom surface 54. Each via liner 52 flares radially outwardly, away from the central axis 56 of the associated hole at the bottom surface so as to form an annular terminal 58 at such bottom surface. Each via liner also flares outwardly, away from the central axis at the top surface 38 so as to form a contact support structure 60. The periphery of each contact support is generally square.

Each contact unit 29 has four apertures 64 extending through the ring-like anchor portion 26, from its bottom surface 21 to the upwardly-facing base surface 24. One contact unit 29 is disposed on each contact support 60, substantially in alignment with the square boundary thereof. Each contact unit is secured to the associated contact support by four posts 66 integrally with the contact support 60 and extending upwardly through the hole 64 in the contact unit. Each post 66 has an outwardly protruding ridge or bulbous portion 68 at the end of the post remote from the contact support 60, overlying base surface 24. These posts and bulbous portion thus secure each contact unit 29 to the corresponding contact support 60 so that the individual contacts or tabs 20, and particularly the tips 28 thereof, protrude radially inwardly, toward the axis 56 of the associated hole 46 in the connector body so that tips of the contacts or tabs 20 overly the hole 46. The posts and the contact supports 60 also electrically connect each contact unit to the associated via liner and thus to the terminal 58 on the bottom surface.

Figure 2:
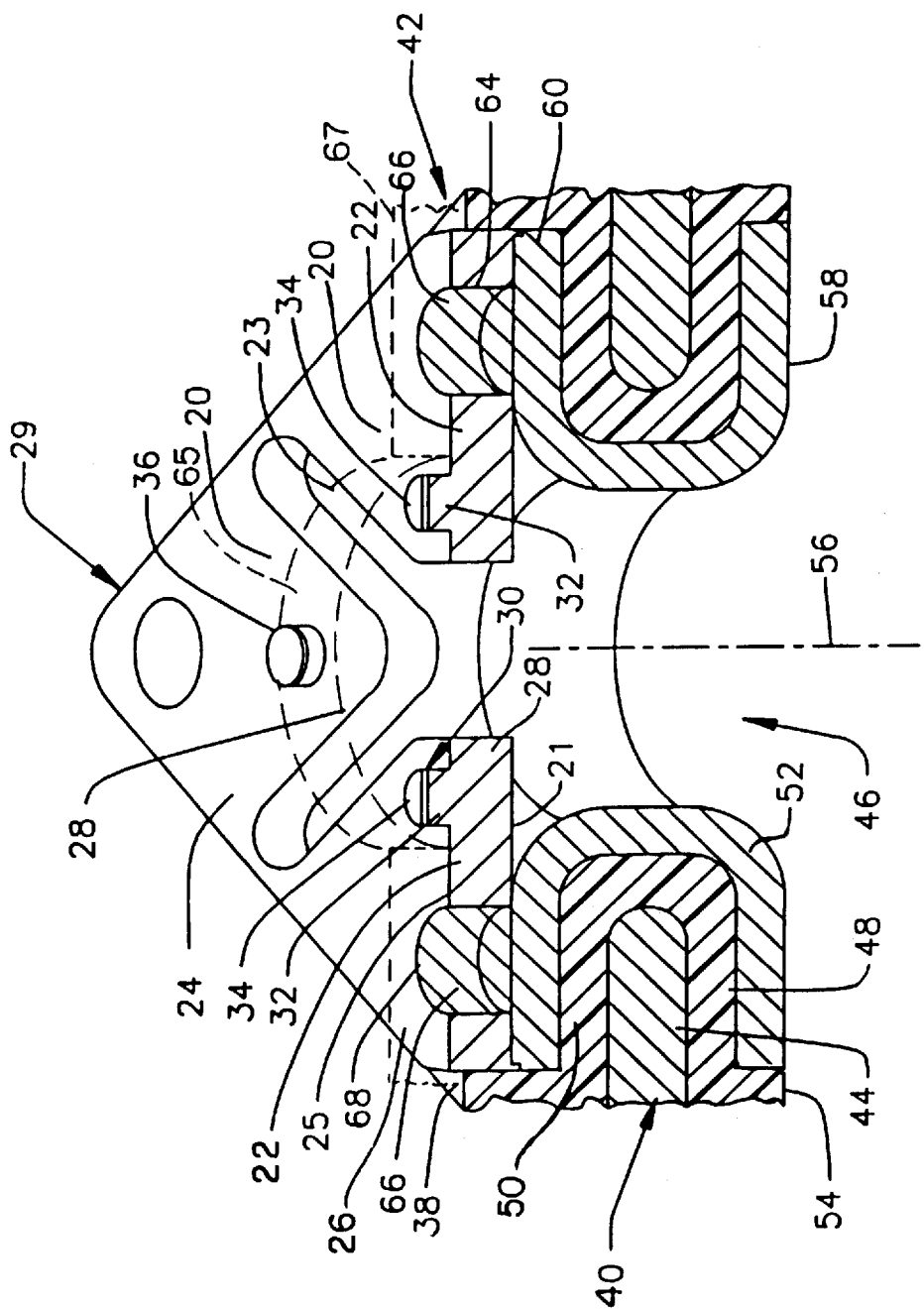
FIG. 2 is a fragmentary, diagrammatic partially sectional view on an enlarged scale along lines 2—2 in FIG. 1.

Contact units 29, and hence the individual contacts or tabs 20 are disposed in a regular pattern corresponding to the patterns of holes 46 in body 40. The asperities 30 on the contacts are also disposed in a regular pattern, in registration with the pattern of contacts 20, so that the same number of asperities are disposed on each contact. In the embodiment of FIGS. 1 and 2, only one asperity is disposed on each contact. However, because both the asperities and the contacts are disposed in regular patterns, all of the contacts are provided with asperities. Also, the asperity on each contact is at the same location namely, adjacent the tip of the tab or contact, remote from the anchor region of the contact unit.

Figure 3:
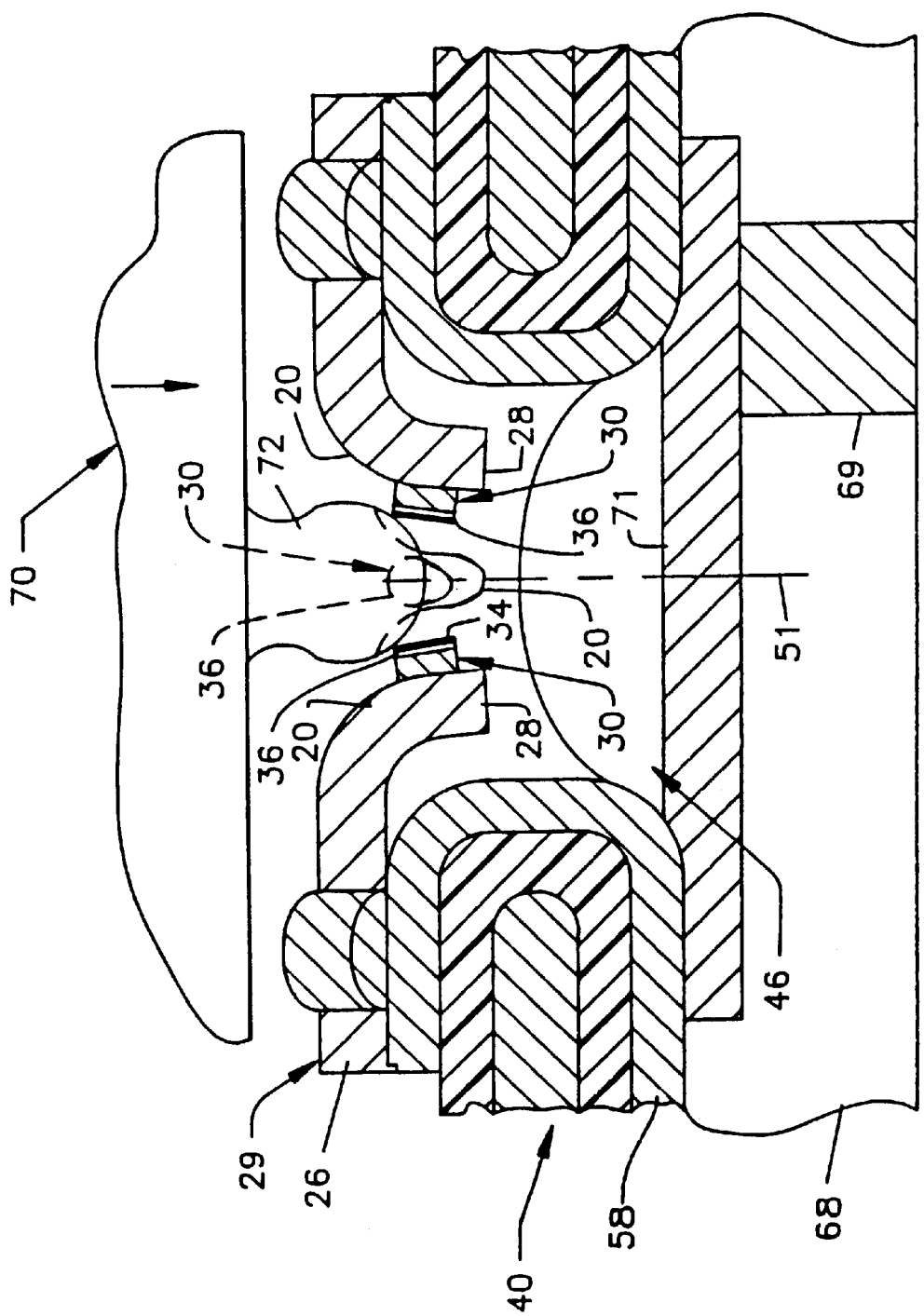
FIG. 3 is a view similar to FIG. 2 but illustrating the connector during engagement with microelectronic element.

The connector of FIGS. 1 and 2 may be engaged with a larger substrate, such as a multilayer substrate 68 having leads 69 therein. Each such lead having an exposed end 71 at the surface of the substrate. The terminals 58 of the connector, and thus the contact units 29, may be electrically connected to the internal leads 69 of the substrate by conventional lamination and/or solder bonding methods, or by the lamination and interconnection methods taught in International Patent Application 92/11395, the disclosure which is hereby incorporated by reference herein. After assembly to the substrate, the connector of FIGS. 1 and 2 is engaged with a mating microelectronic element 70 so that a bump lead or solder ball 72 engages each contact unit 29. Thus, the mating microelectronic element 70 has bump leads 72 in a pattern corresponding to the pattern of holes 46 and contact units 29. Microelectronic element 70 is juxtaposed with the connector so that one bump lead or solder ball 72 is aligned with each contact unit and with the underlying hole 46 in the connector body 40. The microelectronic element is then forced downwardly, towards the connector body and towards the contact units 29 and individual tabs or contacts 20. This downward motion brings each such ball 72 into engagement with all four contacts or tabs 20 of the contact unit 29 and, in particular, engages the ball 72 with the asperities 30. As illustrated in FIG. 3, the anchor portion or outer periphery 26 of each contact unit remains substantially in fixed position, whereas the distal regions of each tab 20, adjacent the tips 28 of the tabs, bend downwardly, in the direction of motion of the engaged ball 72. In this condition, a part of each sharp edge 36 faces upwardly, in the direction opposite to the downward motion of microelectronic element 70 and ball 72. Each asperity is biased inwardly, towards the central axis 56 of the hole, by the resilience of the tab 20. The upwardly facing portion of each edge 36 tends to dig into the surface of ball 72 and scrapes the surface of the ball as the ball moves downwardly, into hole 46. The sharp-edged asperity on each tab thus scrapes a path along the ball or bump lead 72.

This scraping action effectively removes oxides and other contaminants from the scraped paths. This assures reliable electrical contact between contacts 20 and the balls or leads 72. In particular, the tips of the asperities aid in making contact with the balls or leads 72. Because the cap metal in layer 34 on the tip of each asperity is a substantially oxidation resistant metal, it normally does not have any substantial oxide or contaminant layer. Thus, the ball and contacts form a firm, reliable electrical interconnection. This action is repeated at each contact unit and with each ball or lead 72 on the surface of the microelectronic element, so that reliable interconnections are formed simultaneously between all of the balls or leads and all of the internal conductors 69 of substrate 68. These connections can serve as the permanent or semi-permanent interconnections of the assembly. Alternatively, the electrical connection achieved by mechanical interengagement of the element may be used as a test. connection, so that microelectronic element 70, its connections to substrate 68 and the other elements connected to the same substrate can be tested and operated under power. If a defective connection or component is identified during the test, the same can be removed and replaced readily. Ordinarily, the connector and contacts can be reused.

After completion of the test, the assembly can be permanently bonded together. Each of bump leads 72 incorporates an electrically conductive bonding material compatible with the materials of contacts 20. Alternatively or additionally, the contacts themselves may carry conductive bonding materials. Various bonding materials known to those skilled in the art of microelectronic assemblies can be used for these purposes. For example, the bump leads 72 may be formed entirely from a solder or from a solder layer overlying an interior core (not shown). In this case, the electrically conductive bonding material or solder can be activated by heating the assembly causing the solder to flow. A flux such as a so-called "no-clean" flux can be provided either on the microelectronic element around the solder ball or on contacts 20. Alternatively, a solder paste such as Koki RE4-95K, a 63% tin–37% lead solder in 20–50 micron diameter particles distributed in a no-clean flux can be provided on either the contact units or the balls or leads 72.

Bonding materials other than solder can also be employed, including a low temperature eutectic bonding material, a solid state diffusion bonding material, a polymer-metal composite bonding material or another heat-activatable bonding material. Thus, polymer-metal bonding materials may include a dispersion of a metal such as silver or gold particles in a thermoplastic polymer such as ULTEM\ material or a thermosetting polymer such as an epoxy. Diffusion bonding materials may include layered structures of gold on nickel; alloys of gold and tin such as 80% gold, 20% tin and alloys of tin and silver such as 5% silver, 95% tin. Solders may include alloys such as tin-lead and tin-indium-silver. High-temperature bonding materials may be selected from the group consisting of alloys of gold and tin; gold and germanium; gold and silicon or combinations thereof, the gold and tin alloys being preferred. In accordance with known principles, each type of bonding material normally is employed to bond structures compatible with that bonding material. For example, high-temperature bonding materials and diffusion bonding materials are employed with contact metals and bump lead or ball metals such as gold adapted to form alloys with the bonding material. The bonding material may be carried either on the contact units 29 or on the mating electrical elements or leads 72. The cap metal carried on the tip surfaces of the asperities may constitute the bonding material.

Figure 4:
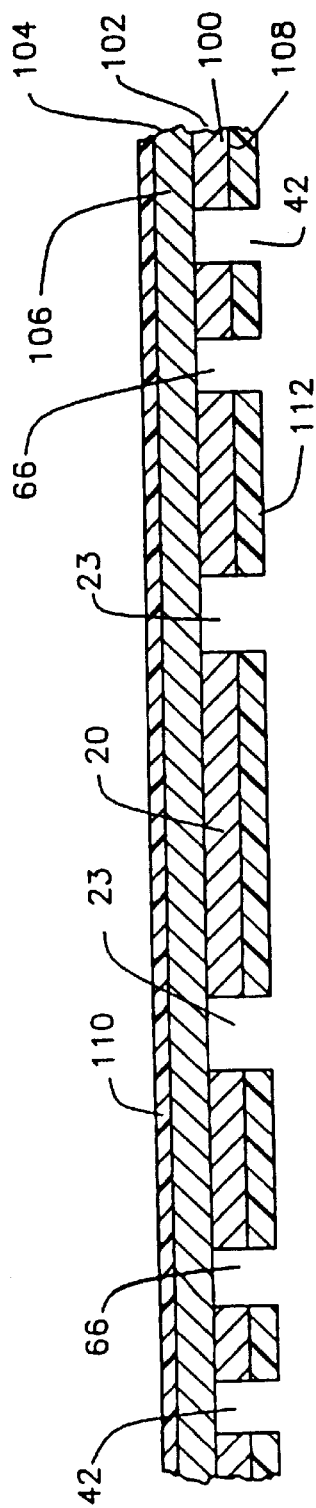

A fabrication process according to a further embodiment of the invention may be utilized to fabricate contact units and connectors as described above. The process begins with a sheet 100 of a base metal (FIG. 4), covered with a thin layer 102 of an etch-stop metal and a further layer 104 of the base metal overlying the etch-stop metal. Thus, sheet 104 defines the top surface 106 of the composite, three-layer sheet whereas sheet 100 defines the opposite, bottom surface 108. The thickness of layer 104 corresponds to the desired height of the base metal column 32 in each asperity 30 (FIG. 2) whereas the thickness of bottom layer 100 corresponds to the desired thickness of the base metal layer 22 constituting each contact tab. In a bottom surface etching step, the top surface is protected by a continuous mask 110, whereas the bottom surface is covered by a layer 112 of a conventional photoresist. The photoresist is patterned using conventional photoexposure and selective removal techniques, so as to leave gaps in the resist. The sheet is then subjected to etching by emerging in an etch solution such as a solution of CuCl, NH$_4$OH and NH$_4$Cl. The etch solution attacks the copper-based alloy of lower layer 100 but does not substantially attack the stop layer 102. The patterning of resist 112 is controlled so that the exposed, etched areas include channels 23 in base metal layer 100 bounding tabs 20, as well as apertures 66 in the anchor regions and slots 42 bounding the anchor regions and subdividing lower layer 100 into individual portions corresponding to the separate contact units discussed above.

Figure 5:
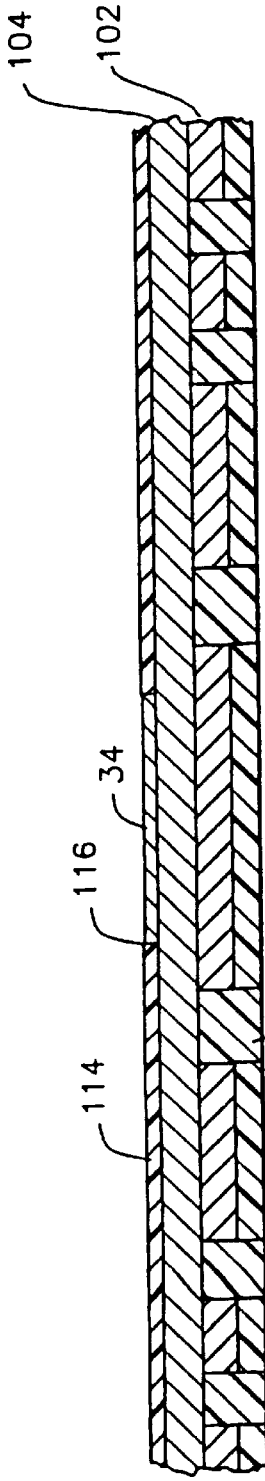
Figure 6:
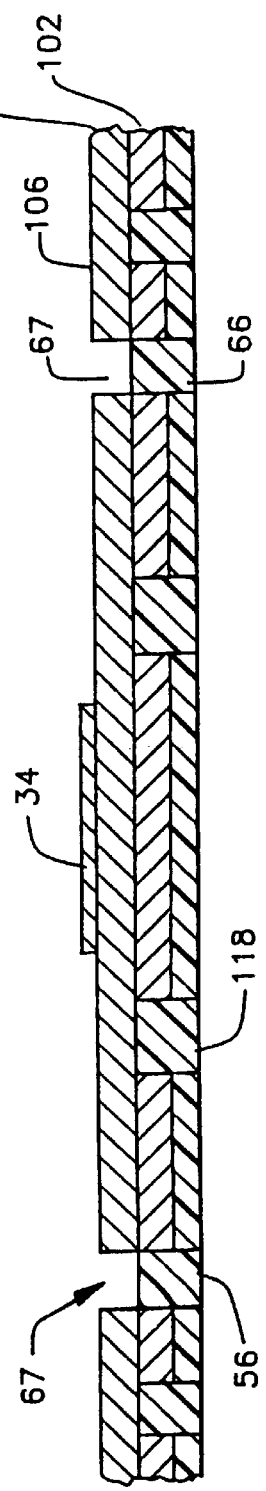

In the next stage, top coating 110 is removed and replaced by a top pattern resist 114 (FIG. 5), which again is patterned using conventional photographic methods to leave openings 116 corresponding to the locations of the asperities 30. Thus, each opening 116 is substantially in the form of a circular hole corresponding to the circular asperity. The features on the bottom surface are covered by a further bottom resist 118, and then the assembly is electroplated with the cap metal 34. At this stage of the process, top base metal layer 104 and stop layer 102 are still solid and continuous. Although only a small portion of the sheet is illustrated, corresponding to portions of one contact unit, it should be appreciated that the sheet includes numerous contact areas, sufficient to form one or more complete connectors. Stop layer 102 and top layer 104 remain continuous and coherent and all portions of the sheet are electrically continuous with one another at this stage.

Following application of the cap metal, top surface holes 67 are formed in alignment with the apertures 66 previously formed in the bottom surface. These top surface holes extend through top base metal layer 104 and extend through stop layer 102. Top surface holes 67 may be formed by applying radiant energy to the top surface 106 of the sheet in a pattern corresponding to the desired pattern of aperture 66 or by etching the top surface using a further patterned mask (not shown). Such an etching process desirably uses a CuCl NH$_4$OH and NH$_4$Cl etch solution to etch from the top surface to top layer 102, followed by a further etch using an FeCl and HCl etch solution to etch through stop layer 102. Following this procedure, any mask used in forming top holes 67 is removed, and the bottom masking 118 is also removed.

In this condition, the sheet is laminated to a connector body 40 having the structure discussed above, with pre-existing holes, via liners 52 and contact supports 60. At this stage of the process however, the post 66 and bulbous portion 68 have not yet been formed. The lamination procedure is conducted so as to align each region which will ultimately become a contact unit 29 with the corresponding hole 46 and with the corresponding contact support 60. The dielectric material on the top surface of the connector body desirably softens and penetrates into the slots 42 between adjacent connector units. In the next stage of the process, the bottom surface of connector body 40 is covered with a masking layer 120 (FIG. 7), thus protecting the bottom surface of base metal layer 100. The assembly is then immersed in a further etching solution, such as a CuCl and HCl etching solution which attacks the base metal. This further etch solution removes the base metal of top layer 104 everywhere except at the spots covered by cap layers 34. This etching procedure thus forms base metal columns 32 extending upwardly from the base metal layer 100 and upwardly from the stop metal layer 102. The etch procedure thus forms asperities 30 in the areas covered by cap layers 34. This etching procedure also leaves each asperity with a sharp edge 36 defined by the cap layer and surrounding the tip of the asperity.

Following this etch procedure, a further masking layer (not shown) is applied on the stop layer 102 and on the other upwardly facing features, leaving holes only in alignment with apertures 66. The assembly is then electroplated with a metal compatible with contact supports 60, such as copper, thereby forming post 66 and outwardly extending or bulbous tips 68. Following this procedure, the mask used is removed and a further mask is applied and photodeveloped to leave a pattern of openings corresponding to the desired pattern of channels 23 and slots 42. A further etch solution, capable of attacking stop layer 102, such as an FeCl/HCl solution, is applied and allowed to attack the stop layer in the open areas of the mask until the etch solution breaks through stop layer 102 at slots 42, thereby subdividing the original coherent metallic sheet into individual contact units. The etch also breaks through at channels 23, thereby converting individual portions of each contact unit into individual contacts or tabs 20 in the configuration discussed above. The bottom mask is then removed, leaving the connector in the configuration discussed above with reference to FIGS. 1 and 2.

During the process discussed above, the sheet remains physically coherent and electrically conductive until the last etching phase, so that the sheet can be successfully mounted on the connector body and successfully electroplated to form the posts. Each of the individual steps of the process requires only conventional masking and etching techniques. Because the asperities are performed in the same series of process steps as used to form the contacts and contact units, the asperity pattern can be provided in good registration with the contact pattern.

Figure 10:
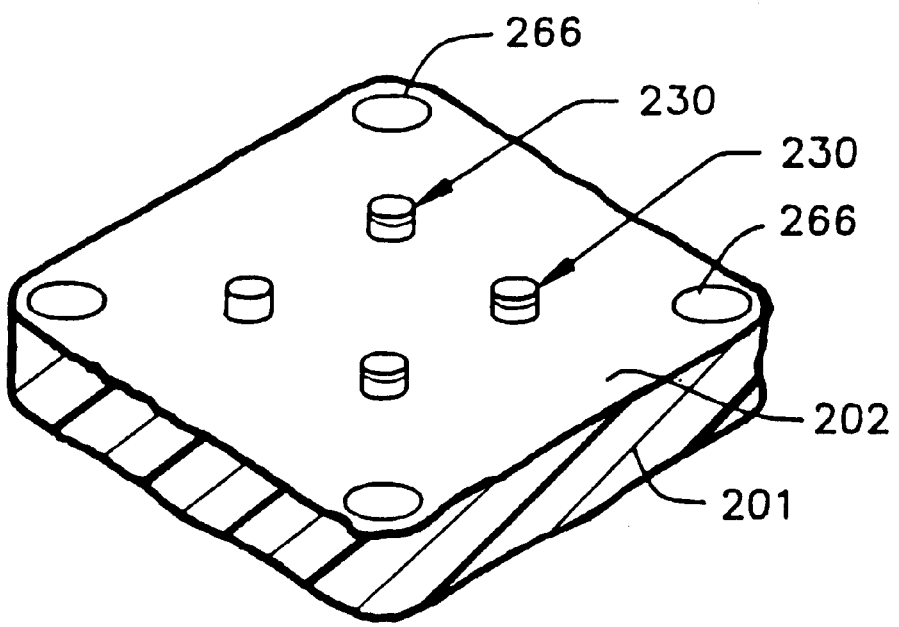
FIGS. 9, 10 and 11 are fragmentary, partially sectional views depicting a connector in accordance with a further embodiment of the invention during successive states of fabrication process.
Figure 9:
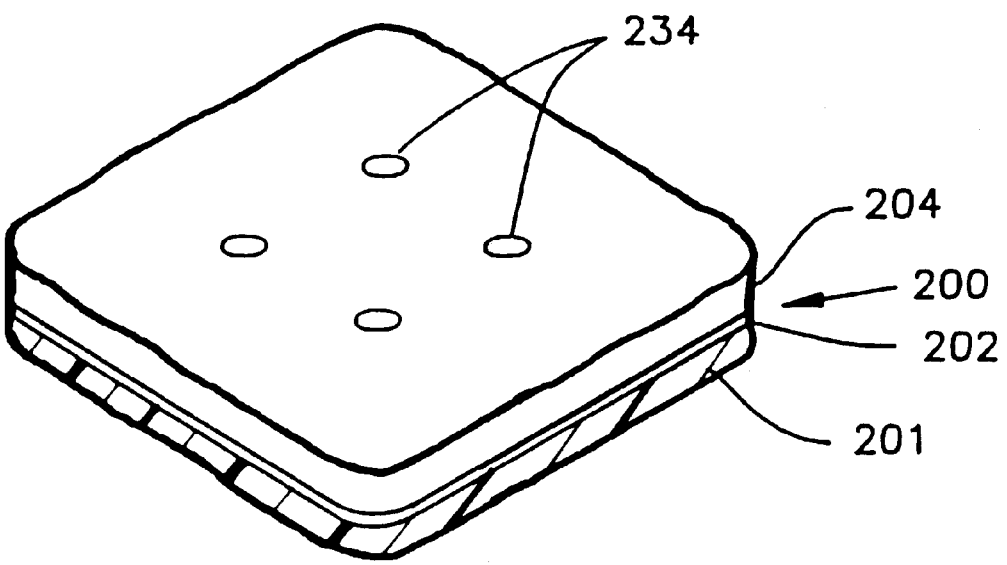

A process according to a further embodiment of the present invention begins with a composite sheet 200 (FIG. 9) incorporating a top base metal layer 204 and stop layer 202 similar to those discussed above over a bottom layer 201 formed from a flexible but resilient polymeric material, desirably a polyimide. Top layer 204 has a thickness approximately equal to the desired height of the asperities, typically about 5 microns to about 25 microns, and may be formed from a readily etchable metal such as copper or a copper based alloy. Stop layer 202 includes a material, such as nickel, which resists etchants that attack top layer 204. Stop layer 202 may be a composite layer, incorporating a sublayer about 0.5 microns to about 2.0 microns of the etch resistant metal over another sublayer of copper or other metal less than about 10 microns thick. The bottom polyimide layer desirably is about 10 microns to about 50 microns thick. In the process, an etch resistant material such as a photoresist is applied in a pattern of spots 234 corresponding to the desired pattern of asperities. Here again, although only a few asperities adapted to form parts of a single contact unit are illustrated, the actual sheet encompasses a relatively large area, corresponding to many contact units. The sheet is then subjected to an etching process using an etchant which attacks the top layer 204 but which does not attack either the stop layer 202 or the bottom layer 201 as, for example, CuCl/HCl solution. This leaves asperities 230 (FIG. 10) protruding upwardly from stop layer 202, in a pattern corresponding to the pattern of etch resistant spots 234, and leaves stop layer 202 as a continuous electrically conductive layer. The resist constituting spots 234 is then removed and a further resist is applied with open areas corresponding to apertures 266. While this resist is in place, the assembly is subjected to a further etching process, thus removing stop or conductive layer 202 in the areas corresponding to apertures 266. After removal of the stop layer in these areas, the assembly is subjected to laser ablation using a KrF excimer laser, or using other suitable radiation which is strongly absorbed by the polymer of bottom layer 201. This extends apertures 266 entirely through bottom layer 201. In this condition, the sheet is still coherent and electrically conductive over its entire area.

The sheet is then laminated to a connector body 240 (FIG. 11) in the essentially the same manner as discussed above with reference to FIG. 7. Thus, the sheet is aligned with the connector body so that each zone of the sheet constituting an individual contact unit is aligned with the corresponding hole and contact support of the connector body. The sheet is laminated to the top surface of the connector body so as to physically secure the sheet to the connector body. In this operation, the polymeric material of bottom layer 201 desirably merges with the dielectric material of the connector body itself. Following this lamination operation, the assembly is electroplated to form posts extending through apertures 266. These posts merge with the contact supports of the connector body and with the stop layer 202 in substantially the same way as post 66 described above with reference to FIG. 7. The posts provide electrical continuity through bottom layer 201, so that each zone of the stop or conductive layer 202 is electrically connected to the corresponding contact support and via liner (not shown) of the connector body.

Figure 11:
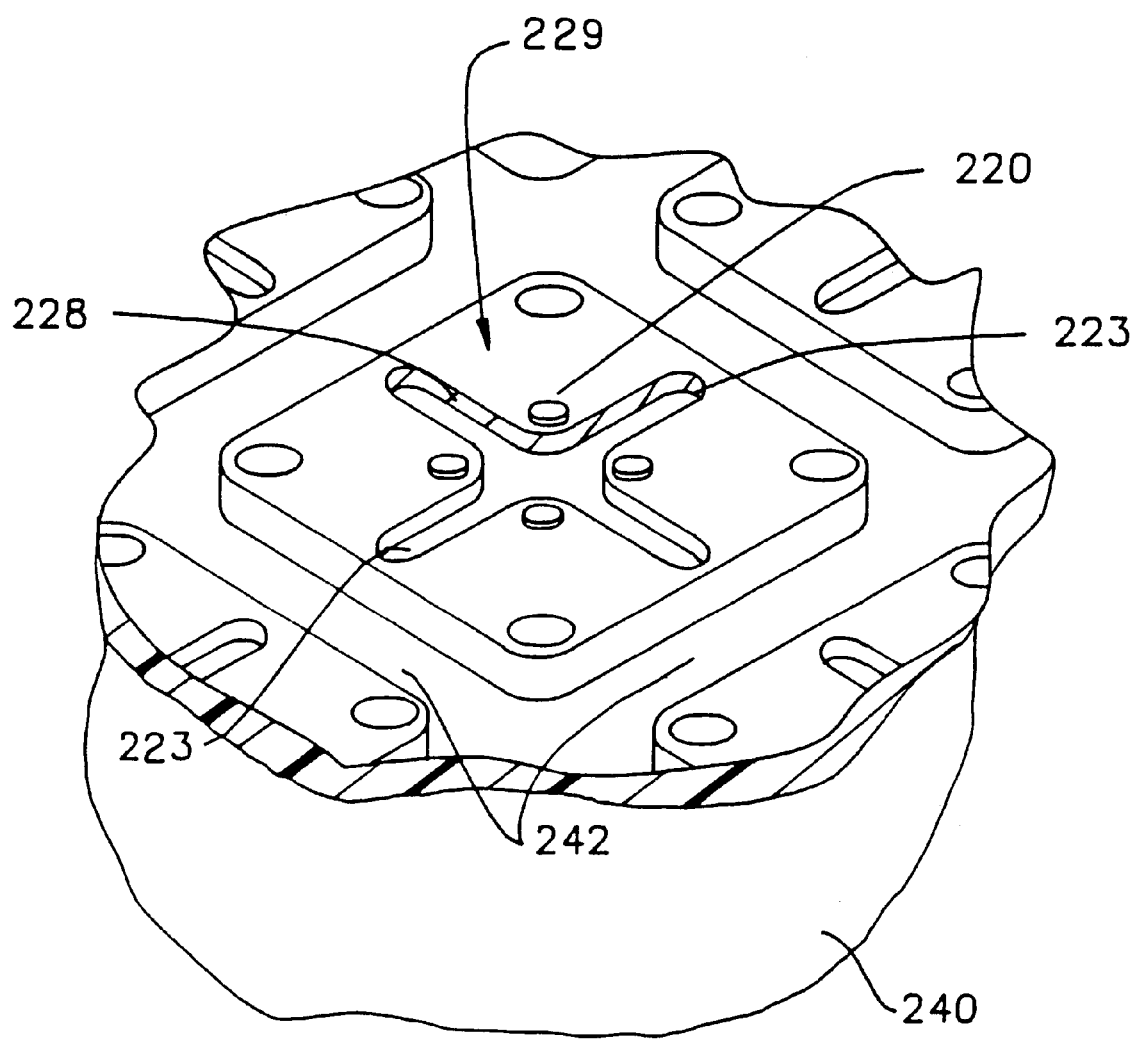

In the next stage of the process, the stop layer is etched, using a conventional masking and etching procedure, to form channels 242 subdividing the stop layer into individual contact units 229 (FIG. 11). The stop layer is further etched to form channels 223 subdividing the stop layer within each contact unit into individual tabs or contacts 220. Following this etching procedure, the assembly is once again subjected to laser ablation in the areas corresponding to channels 223. During this laser ablation process, the surrounding regions of stop layer 202 serve as a mask, and precisely limit the laser ablation process to the channels 223. This laser ablation process removes the underlying portions of layer 201 leaving the individual tabs or contacts 220 disconnected from one another at their tips 228. Thus, the individual tabs of each contact unit 229 project inwardly over the associated hole (not shown) in the connector body, in substantially the same manner as discussed above with reference to FIGS. 1 and 2.

The tabs or contacts formed by this process are composite; each tab incorporates a lower layer 201 formed from polymeric material, a relatively thin electrically conductive layer overlying that polymeric material and an asperity extending upwardly from the polymeric layer and conductive layer. Desirably, the conductive layer, formed from stop layer 202, is thinner than the polymeric layer. Thus, the conductive layer may be less than about 10 microns thick, desirably between about 0.5 micron and about 3 microns thick and more preferably between about 0.5 micron and about 2.0 microns thick. This construction makes it practical to provide relatively low spring constants, and to allow for substantial deformation of the tabs while maintaining relatively low stress levels in relatively short tabs. For example, each tab may be between about 100 and about 300 microns long, from the anchor region to the asperity. During use, each tab acts as a cantilever beam. Because the polymeric layer has a modulus of elasticity far lower than a metallic layer, the stiffness of the composite beam can be relatively low, and can be controlled accurately. As described above, the composite contacts most preferably are provided with asperities to provide the scraping action. However, the composite contacts provide significant advantages even where the scraping action provided by the asperities is not required. For example, in certain special bonding processes, such as gold-to-gold diffusion bonding conducted under conditions where both the contacts and the mating elements are maintained free of surface impurities, acceptable bonding can be achieved without the scraping action. Thus, a connector according to a further embodiment of the invention, for use in such a process, may include composite contacts with the polymeric layer and with the thin conductive layer, but without the asperities. Such a connector provides the advantage of well-controlled interengagement forces.

A connector in accordance with another embodiment of the present invention includes a connector body 300 and a plurality of individual contacts 302 mounted on a top surface 304 of the connector body. Each contact 302 includes an anchor region 306 closely overlying connector body top surface 304 and secured to the connector body. A terminal 308 formed integrally with the contact is provided at a proximal end of each anchor region 306. A flexible tab 310 extends from the opposite, distal end of each anchor region 306, the tab being joined to the anchor region along a hinge line 311. Each such tab is generally in the form of a strip extending upwardly, away from the connector body top surface 304. Each such strip defines a base surface 312 facing upwardly, away from the connector body. Two asperities 314 are provided on each contact. Each asperity is generally in the form of a rectilinear slab having a generally vertical, generally planar front surface 316, substantially perpendicular to base surface 312. Vertical surface 316 faces generally in the direction of the elongation of the strip constituting tab 310, and faces towards the distal end of the tab, away from the anchor region 306. Vertical surface 316 intersects the tip surface of the asperity, remote from the base surface. The intersection defines a generally linear sharp edge 318 partially bounding the top surface of the asperity. Edge 318 faces away from the anchor region and extends generally parallel to the line of juncture or hinge line 311 between the anchor region and tab 310. The asperity may also define a similar sharp edge facing in the opposite or proximal direction towards the anchor region 306. Each slab-like asperity includes a base metal portion 322 and a cap portion 324 at the tip, the cap metal portion defining edge 318. The cap metal and base metal may incorporate materials as discussed above.

In use, the connector is engaged with a microelectronic device 370 having connection pads 372 by juxtaposing the microelectronic device with the connector so that the pad-bearing surface of the microelectronic device faces the contacts of the connector and then forcing the microelectronic device and connector towards one another. The force used for this purpose may be applied by conventional mechanical force-applying devices incorporated in a test fixture (for temporary assembly) or in a package (for permanent assembly). The force-applying device is symbolized in FIG. 14 by a spring 374. However, the force-applying device may include essentially any mechanical element capable of applying the requisite force, such as a fluid power device, weights or springs in fixtures and deformable elements such as flexible or crimped enclosures, adhesives, elastomers, clamps or other force-applying elements in permanent packages. As the contact pads 372 of the microelectronic element engage the tabs 310 of the contacts, the tabs flex bending generally about the line of joinder 311 between each tab 310 and the associated anchor region 306. This flexing movement causes the asperities 318 to move generally horizontally, in the directions indicated by arrows 330 in FIG. 14, thus causing the asperities to wipe across the contact pads 372 and causing leading or distally facing edges of the asperities on each contact to scrape the surfaces of the contact pad. Once again, the scraping action removes contaminants from the contact pads and promotes effective electrical interconnection between the contact pads 372 and the contacts of the connector. The same scraping action also promotes formation of effective permanent bonds between the engaged contacts and connection pads when the bonding material carried on the contacts or applied separately is activate.

Figure 15:
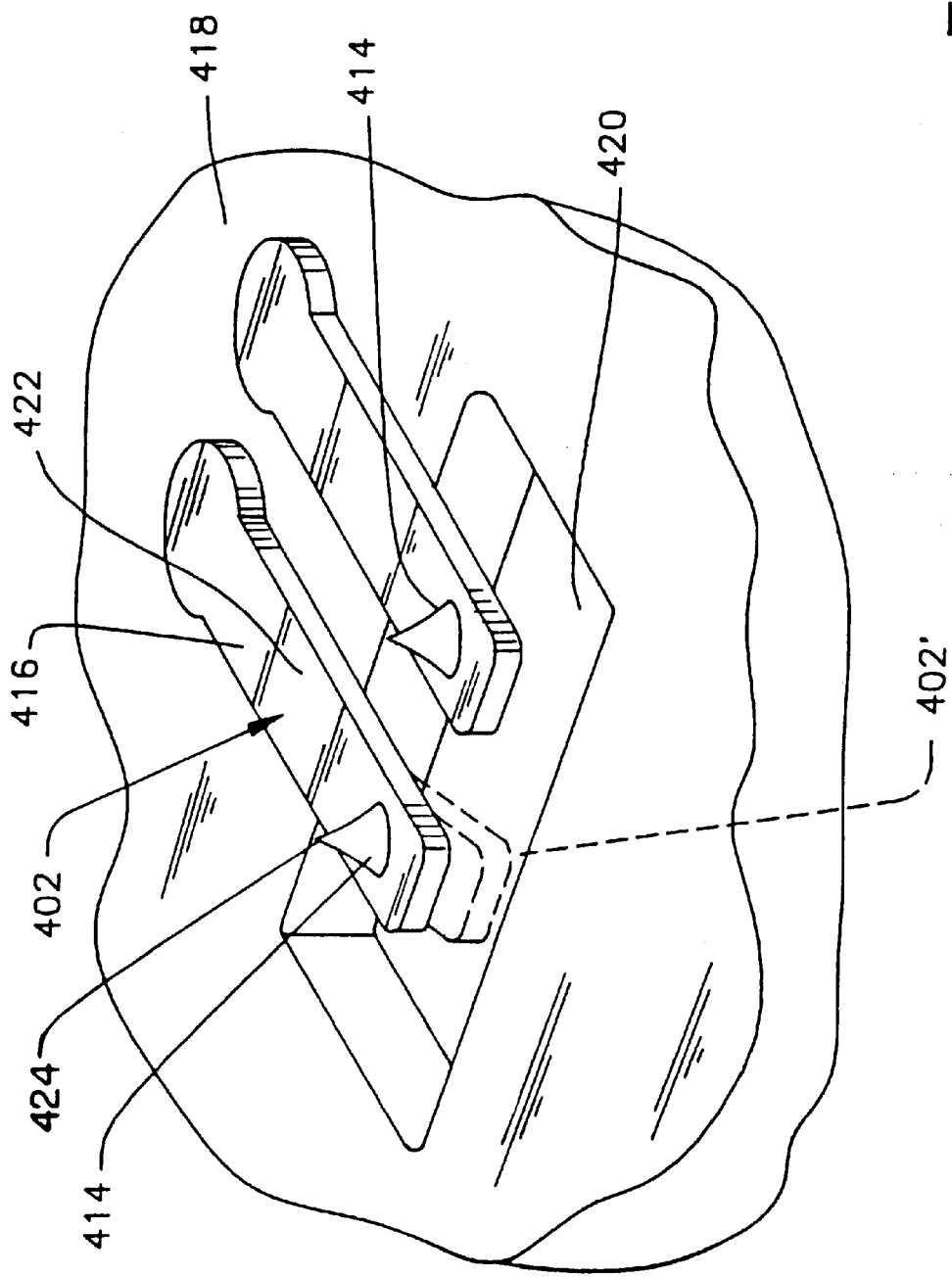
FIG. 15 is a diagrammatic, perspective view of a connector in accordance with another embodiment of the invention.
Figure 16:
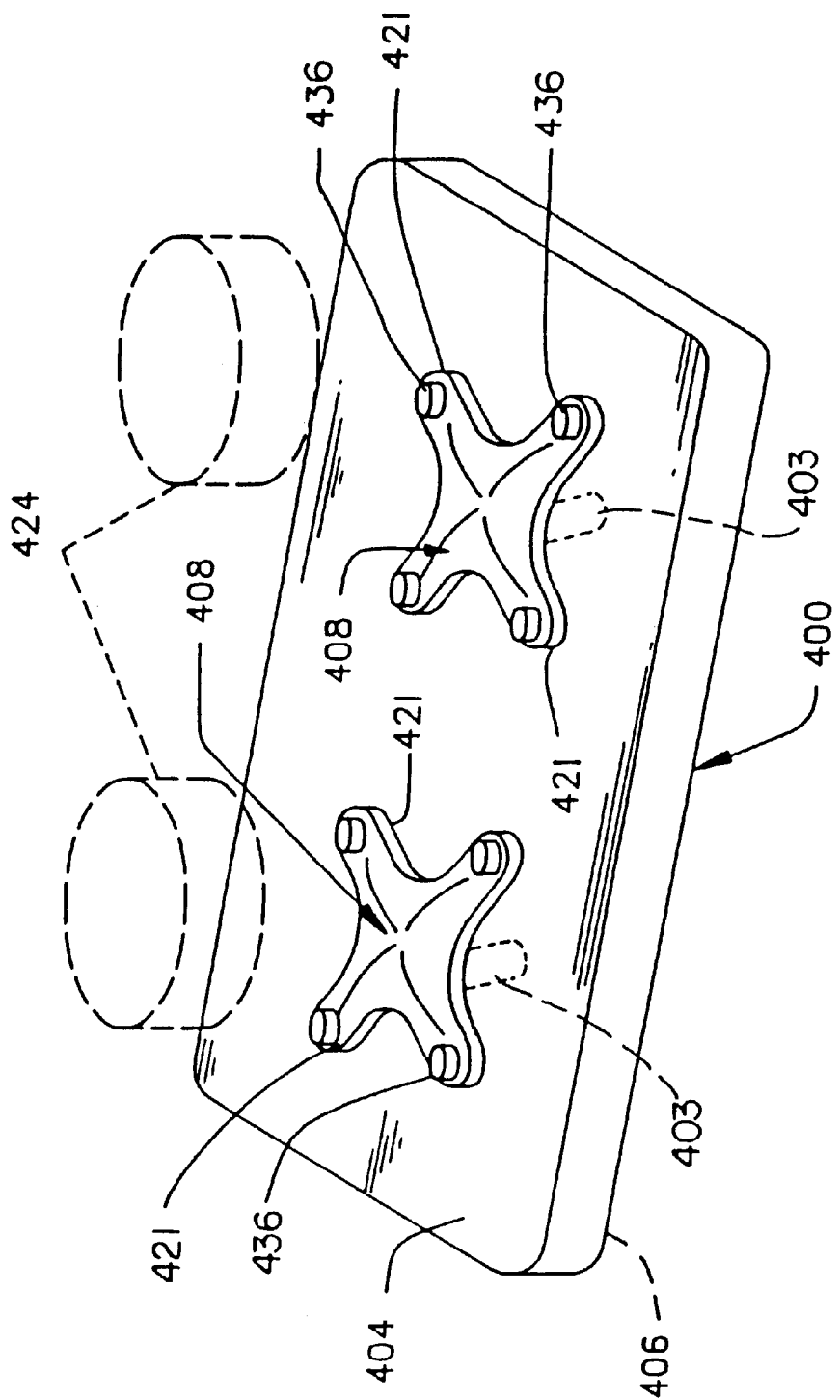
FIG. 16 is a fragmentary, diagrammatic perspective view of a connector in accordance with a further embodiment of the invention.
Figure 17:
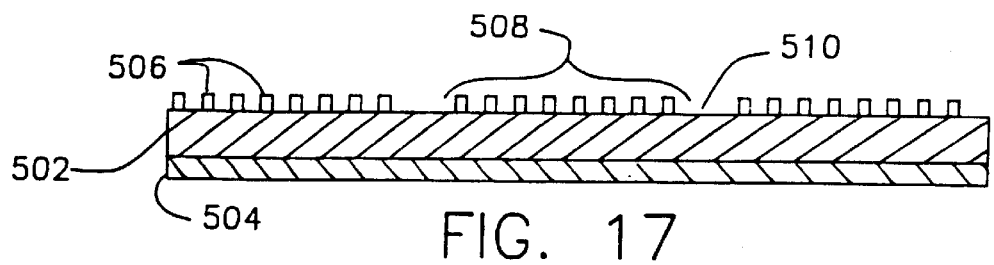
FIGS. 17 through 21 are fragmentary, diagrammatic sectional views depicting portions of a connector in accordance with a further embodiment of the invention during successive stages of manufacture and use.
Figure 18:
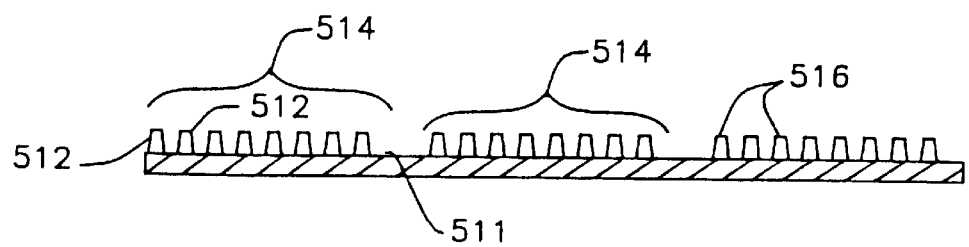
Figure 19:
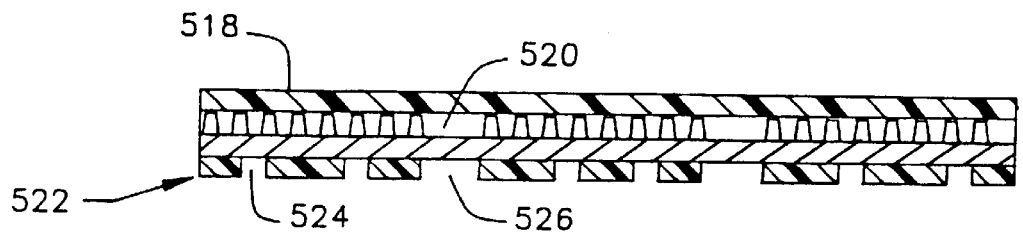

The connector illustrated in FIG. 15 has contacts 402 in the form of elongated tabs, each such contact having an asperity 414 adjacent a distal end. Here again, the asperities are disposed in a predetermined, regular pattern, as are the contacts so that a predetermined number of asperities, in this case one asperity is disposed on each contact, in a predetermined location on the contact. The proximal end 416 of each contact is secured to the underlying connector body 418, whereas the distal end overlies a gap 420 in the connector body. Each asperity 414 is generally in the form of a body of revolution about an axis perpendicular to the upwardly facing base surface 422 of the contact. Each such body of revolution tapers to a sharp point 424 at its end remote from the base surface 422. In use, such contact is engaged with the mating elements in the manner discussed above. The distal end of the contact flexes downwardly, into opening 420 in the connector body and hence applies a resilient, upward force tending to bias the point 424 of each contact into engagement with the mating element. Here again, the sharp asperities scrape the mating element as the mating element moves relative to the contact and as the contact deforms downwardly, to the position illustrated in broken lines at 402'. Sharp points as illustrated in FIG. 15 can be formed by depositing small spots of an etch resistant material on the top surface of a sheet and then subjecting the sheet to an isotropic etching, so that the etch solution undercuts the spots.

A connector in accordance with a further embodiment of the present invention may include a connector structure generally as described in copending, commonly assigned U.S. patent application 08/277,336, the disclosure of which is hereby incorporated by reference herein. The connector may include a connector body 400 and a plurality of conductors extending in the body as, for example, through conductors 403 extending between the top surface 404 and bottom surface 406 of the body. Contacts 408 may be connected to the conductors, and each contact may flare radially outwardly from the associated conductor. Each contact may be arranged so that the periphery of the contact will expand radially outwardly, away from the associated conductor, in response to a vertical force directed toward the body applied to the contact. Thus, each contact may include a plurality of tabs 421 arranged so that the tabs can be bent downwardly towards the body when the tabs are engaged with mating electrical elements such as contact pads 424 of a microelectronic device. The tabs may be spaced above the top surface 404 of the connector body, or the body may incorporate a material at the top surface which can be softened during assembly, to permit downward movement of the tabs.

In this embodiment of the present invention, sharp-featured asperities are provided on the contacts 408 at locations such that the outward expansion of the contacts will cause the asperities to scrape the mating contact pads 424. The asperities desirably have sharp edges 436 extending at least around the outwardly-facing portion of each asperity. These asperities may be formed by processes as described above.

A manufacturing process in accordance with a further embodiment of the invention begins with a sheet 502 of a first metal such as beryllium copper, phosphor bronze or the other resilient metals discussed above. A continuous protective layer 504 is applied on the bottom surface of the sheet. A photoresist is applied on the top surface and selectively exposed and developed to form numerous circular dots 506 on the top surface of the sheet. The dots are arranged in groups 508, each group occupying a square region corresponding to one contact unit. The regions are separated from one another by linear spaces 510 about 0.1 mm wide. The dots are about 12 to 35 microns in diameter. Within each group, the dots are spaced apart from one another at a pitch of about 30 to about 50 microns. Each group 508 includes about 28 dots, and occupies a region about 0.4 mm square, so that the groups are disposed in a recurring rectilinear array with a group-to-group pitch of 0.5 mm. In the next stage of the process, the sheet is etched, so as to form a base surface 511 and asperities 512 protruding upwardly from the base surface. After etching, the resist dots 506 are removed. The asperities are disposed in the same arrangement as dots 506, and disposed in asperity groups 514 corresponding to dot groups 508. Each asperity is generally fustoconical, and includes a circular tip surface 516 remote from the base surface 511. A substantially sharp, circular edge encircles each tip surface. In this embodiment, the tip surfaces and edges are defined by portions of the first metal corresponding to the original top surface of the sheet. The height of the asperities, and the distance between the base surface 511 and the bottom surface of the sheet, is controlled by the depth of etching. Etch depth, in turn, is controlled by known factors including concentration of the etch solution, time of exposure, temperature and agitation. These factors preferably are maintained substantially constant over the entire extent of the sheet.

In the next stage of the process, a cover layer 518 is applied over the top surface, so that the cover layer overlies the tips of the asperities. An adhesive 520 fills the spaces between asperities, including the linear spaces between asperity groups, and holds the cover layer to the sheet. The cover layer and adhesive may be provided in a prepared assemblage, such as the material available under the trademark COVERLAY from the E.I. DuPont Company. The bottom cover layer 504 is removed and replaced by a bottom photoresist 522. The bottom photoresist is selectively exposed and developed to form linear slots 526 aligned with the linear spaces between groups of asperities, the slot channels being narrower than the spaces. The bottom photoresist also includes channel openings 524 arranged in an X-shaped pattern beneath each asperity group. The sheet is then etched again, until the etch breaks through to base surface 511 on the top side of the sheet, so as to form slots 530 bounding each asperity group 514 and isolating each such asperity group from the others. The same etching step also forms channels 528 in an X-shaped pattern within each asperity group. This step thus subdivides the sheet into individual contact units corresponding to the individual asperity groups 514, and forms four contacts or tabs 532 within each such contact unit.

Figure 20:
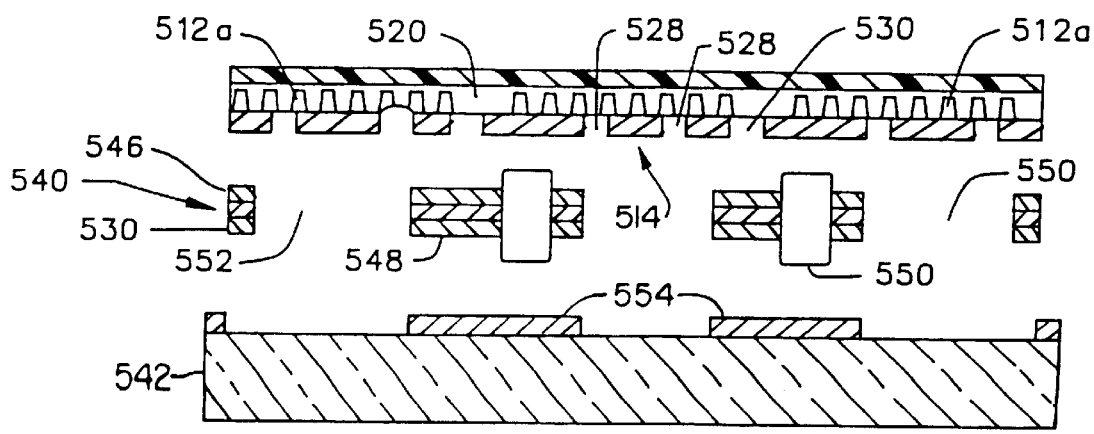
Figure 21:
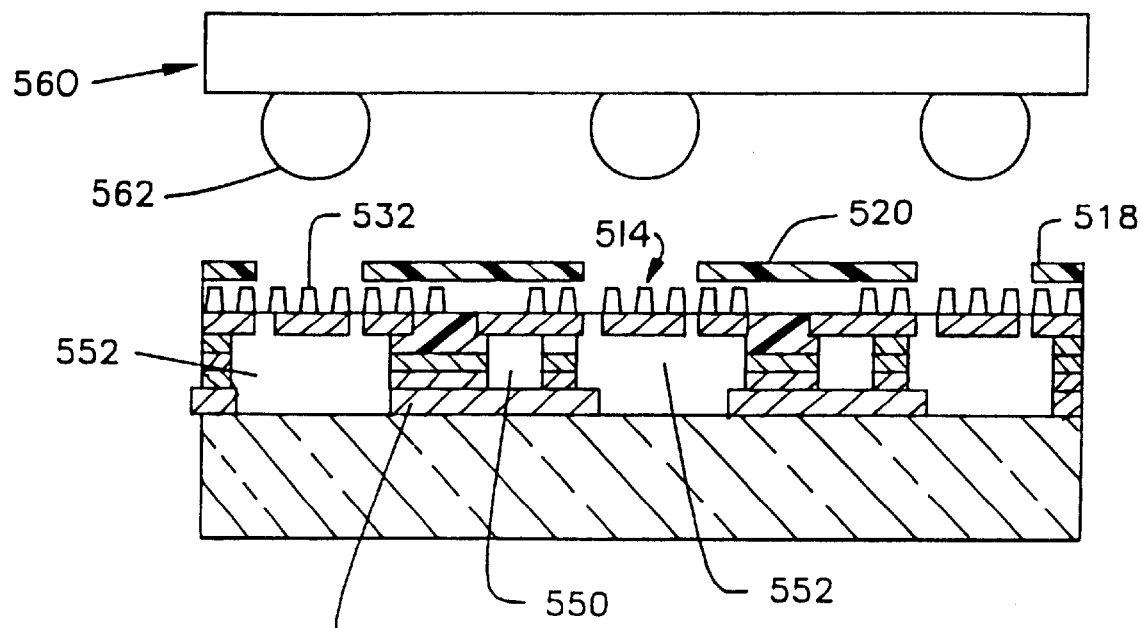
Figure 22:
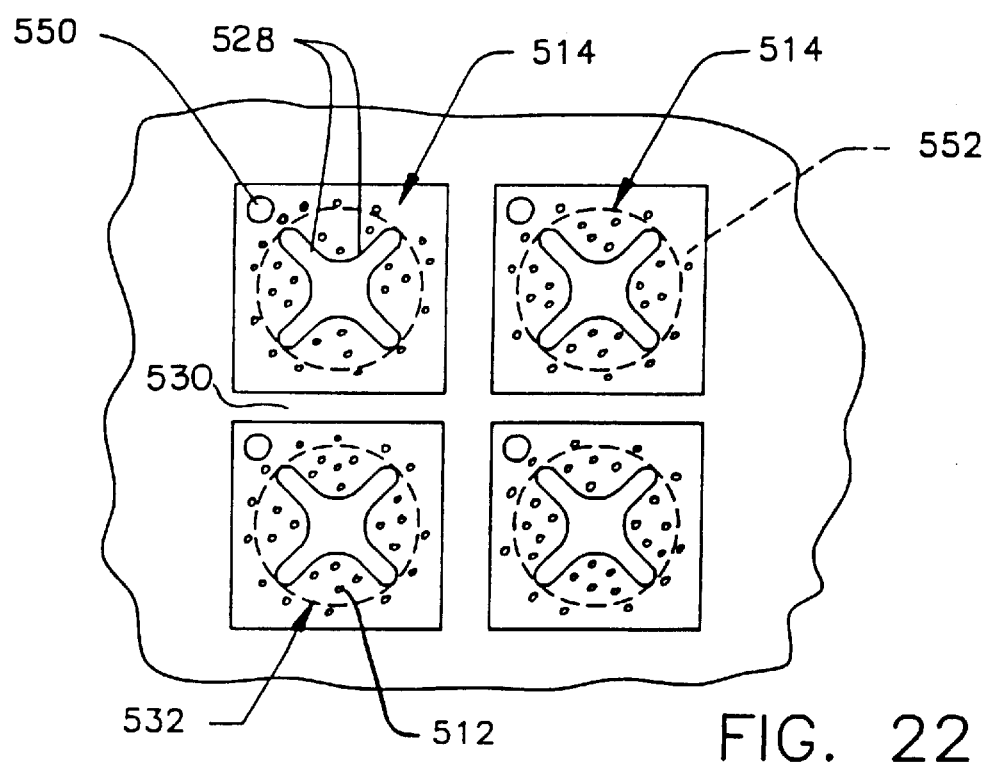
FIG. 22 is a fragmentary top plan view of a the connector depicted in FIGS. 17–21.

The registration between the asperity pattern on the top surface and the channel openings in the bottom photoresist is not precise. Some asperities 512a (FIG. 20) overlie the areas etched to form the channels. However, the spacing between asperities is small in comparison to the dimensions of the tabs 532, so that each tab includes at least one asperity.

In the next stage of the process, the bottom resist 522 is removed, leaving the assemblage of the etched sheet and cover layer. This assembly is then laminated to with an interposer 540 and a substrate 542. Interposer 540 includes a dielectric sheet 544 and flowable dielectric layers 546 and 548 on the top and bottom surfaces of such sheet. The interposer further includes conductors 550 formed from flowable conductive material extending through the dielectric sheet and flowable dielectric layers. The dielectric and conductive materials may be those used in the interposers described in U.S. Pat. 5,282,312, the disclosure of which is hereby incorporated by reference herein. For example, the flowable dielectric may be an epoxy, whereas the flowable conductive material may include a polymer filled with metallic particles. The interposer has through holes 552 disposed in a rectilinear grid pattern corresponding to the pattern of contact units or asperity groups 514. Conductors 550 are disposed in a similar grid offset from the grid of holes. Substrate 542 includes contact pads 554 disposed in a similar grid, and internal circuitry (not shown) connected to the contact pads. The substrate may also include other elements (not shown) for connecting the internal circuitry to other devices.

In the lamination process, the assemblage of etched sheet and cover layer, interposer and substrate are aligned with one another so that the center of each contact unit (at the center of the X-shape defined by the channels 528) is aligned with a hole 552 of the interposer, whereas a conductor 550 of the interposer is aligned with a corner of the contact unit. Each conductor 550 is also aligned with a contact pad 554 of the substrate. The aligned elements are subjected to heat and pressure so as to activate the flowable dielectric and conductive materials and unite the sheet assemblage, interposer and substrate. The flowable material in each conductor 550 electrically connects the aligned contact unit 514 and contact pad 554. The flowable dielectric material on the top surface of the interposer fills slots 530, and merges with the adhesive 520 in the sheet assemblage.

The laminated assembly is then selectively exposed to radiant energy, such as laser light, directed from the top surface at the center of each contact unit. The radiant energy selectively ablates the cover layer 518 and adhesive 520 in the areas overlying the contacts or tabs 532 and channels 528, thus exposing these elements at the top surface of the assembly. By removing the surrounding adhesive and dielectric materials, the radiant energy will also remove any loose fragments of asperities left overlying the channels 528. However, the radiant energy does not substantially melt asperities on the contacts, or substantially dull their edges. The completed connector may now be used in substantially the same manner as the connectors discussed above. Thus, a microelectronic element 560 with bump leads 562 may be engaged with the completed connector so that the bump leads penetrate into holes 552 and engage contacts 552. Here again, the bump leads are engaged and scraped by the asperities on the contacts.

The various contacts described above can be adapted to provide various levels of interengagement force between each contact and the engaged mating electrical element. Interengagement forces between about 0.5 and about 5 grams force per engaged contact or tab are preferred in typical microelectronic applications. The total interengagement force per contact unit, and hence the total interengagement force per bump lead, desirably is between about 2 and about 20 grams force. With the sharp-edged asperity structures discussed above, these relatively small interengagement forces nonetheless provide effective scraping and wiping action. The ability to provide effective scraping action at relatively low force levels is especially significant where numerous contacts must be engaged with numerous mating elements. The degree of wipe or relative movement between the asperity edge and the mating electrical element surface during contact engagement can be relatively small, typically less than about 20 microns and usually between about 5 and 10 microns. Even this small relative movement however is enough for the sharp features of the asperity tips to break through the contaminants on the surface of the mating element.

As these and other variations and combinations of the features set forth above can be utilized without departing from the invention, the foregoing description of the preferred embodiments should be taken by way of illustration rather than by way of limitation of the invention as defined by the claims.

What is claimed is:

1. A method of making an electronic contact comprising the steps of:
    (a) depositing an etch-resistant material in a plurality of spots on a top surface of a sheet including a first metal at said top surface;
    (b) etching said first metal in a first etching process so that at least a portion of the first metal is removed in areas other than said spots, whereby the etched areas will define a base surface and the areas covered by said spots will form asperities projecting upwardly from said base surface, said etching step forming tips on said asperities remote from said base surface and substantially sharp edges bounding said tips.

2. A method as claimed in claim 1 wherein said etch-resistant material is a second metal and wherein said second metal at least partially defines said sharp edges.

3. A method as claimed in claim 2 wherein said second metal consists essentially of one or more metals selected from the group consisting of gold, osmium, rhenium, platinum and palladium and alloys and combinations thereof.

4. A method as claimed in claim 2 wherein said first metal consists essentially of one or more metals selected from the group consisting of copper and copper-bearing alloys.

5. A method as claimed in claim 1 wherein said sheet includes a layer of an etch-resistant stop metal beneath said first metal.

6. A method as claimed in claim 5 wherein said etching step is continued until said stop metal is exposed in said etched areas, whereby said stop metal layer will define said base surface.

7. A method as claimed in claim 1 further comprising the step of subdividing said sheet into a plurality of contact portions, said subdividing step and etching step being conducted so that at least one asperity is disposed on each said contact portion.

8. A method as claimed in claim 7 wherein said subdividing step includes the step of etching said sheet in a second etching process.

9. A method as claimed in claim 8 wherein said second etching process includes the step of etching said sheet from a bottom surface to form grooves in said bottom surface before said first etching step, and wherein said first etching step is performed so that said base surface is disposed opposing said grooves.

10. A method as claimed in claim 1 wherein said step of depositing said etch-resistant material in said spots includes the step of applying a resist to said top surface of said sheet and exposing said resist to radiant energy in a pattern constituting a positive or negative image of said spots.

11. A method as claimed in claim 1 wherein said step of depositing said etch-resistant material in said spots includes the step of applying a resist to said top surface of said sheet and exposing said resist to energetic charged particles in a pattern corresponding to a positive or negative image of said spots.

12. A method as claimed in claim 11 wherein said top-surface of said sheet is non-planar at the time of said exposing step.

13. A method of making an electronic contact comprising the steps of:

(a) in a surface-forming step, etching a top surface of a sheet including a first metal at said top surface so that at least a portion of the first metal is removed except at locations in a predetermined asperity pattern and so that the etched areas define a base surface and asperities will projecting upwardly from said base surface at said locations, said surface-forming etching step forming tips on said asperities remote from said base surface and sharp features at each said tip; and (b) severing said sheet to form a plurality of contact portions according to a predetermined severing pattern, said severing pattern and said asperity pattern being in registration with one another so that at least one asperity is disposed on each said contact portion.

14. A method as claimed in claim 13 wherein said severing step includes the step of forming grooves in a bottom surface of said sheet.

15. A method as claimed in claim 14 wherein said step of forming said grooves is performed before said surface forming step and wherein said surface forming step is performed so as to cut through the sheet at said grooves.

* * * * *

UNITED STATES PATENT AND TRADEMARK OFFICE
CERTIFICATE OF CORRECTION

PATENT NO. : 6,205,660 B1
DATED : March 27, 2001
INVENTOR(S) : Fjelstad et al.

It is certified that error appears in the above-identified patent and that said Letters Patent is hereby corrected as shown below:

Title page,
Item [75], "Distefano" should read -- DiStefano --.

Column 2,
Line 47, "a" should read -- an --.
Line 59, "chip" should read -- chips --.

Column 3,
Line 21, "describes" should read -- describe --.
Line 30, "a" should read -- an --.

Column 4,
Line 36, cancel "co".

Column 5,
Line 25, after "asperities" insert -- . --.
Line 34, "on" should read -- and --.
Line 39, cancel "mating" (second occurrence).
Line 58, "provides" should read -- provide --.
Line 66, "defines" should read -- define --.

Column 7,
Line 38, "states" should read -- stages --.

Signed and Sealed this

Eleventh Day of December, 2001

Attest:

NICHOLAS P. GODICI
Attesting Officer   Acting Director of the United States Patent and Trademark Office